(12) United States Patent
Furukawa

(10) Patent No.: US 6,746,820 B2
(45) Date of Patent: Jun. 8, 2004

(54) LIGHT-SENSITIVE COMPOSITION AND LIGHT-SENSITIVE LITHOGRAPHIC PRINTING PLATE

(75) Inventor: Akira Furukawa, Tokyo (JP)

(73) Assignee: Mitsubishi Paper Mills Limited, Tokyo (JP)

( * ) Notice: Subject to any disclaimer, the term of this patent is extended or adjusted under 35 U.S.C. 154(b) by 102 days.

(21) Appl. No.: 10/073,187

(22) Filed: Feb. 13, 2002

(65) Prior Publication Data

US 2002/0182537 A1 Dec. 5, 2002

(30) Foreign Application Priority Data

Feb. 16, 2001 (JP) .......................... 2001-040740

(51) Int. Cl.$^7$ .......................... G03C 1/725; G03F 7/004
(52) U.S. Cl. .................. 430/281.1; 430/270.1; 430/287.1; 430/302; 430/914
(58) Field of Search .................. 430/270.1, 281.1, 430/302, 914, 287.1

(56) References Cited

U.S. PATENT DOCUMENTS 6,022,906 A * 2/2000 Ohwa et al. .................... 522/8
6,329,442 B1 * 12/2001 Sugita et al. .................. 522/7

FOREIGN PATENT DOCUMENTS

JP 53-2403 * 1/1978

OTHER PUBLICATIONS

Aoshima, US publication US 2003/0073032 A1, Apr. 2003.*

* cited by examiner

*Primary Examiner*—Rosemary Ashton
(74) *Attorney, Agent, or Firm*—Paul E. White, Jr.; Manelli Denison & Selter PLLC

(57) ABSTRACT

There are disclosed a light-sensitive composition which comprises a polymer comprising a carboxyl group and a polymerizable double bond at the side chain, an organic-borate salt, and a hindered amine compound or a protonic acid captor; and a lithographic printing plate which comprises an aluminum plate and a light-sensitive layer comprising the above light-sensitive composition.

15 Claims, No Drawings

LIGHT-SENSITIVE COMPOSITION AND LIGHT-SENSITIVE LITHOGRAPHIC PRINTING PLATE

BACKGROUND OF THE INVENTION

1. Field of the Invention

This invention relates to a light-sensitive composition and a light-sensitive lithographic printing plate. More specifically to a light-sensitive composition which is capable of forming an image by scanning exposure such as laser, etc., and suitable for forming a lithographic printing plate, a resist for forming a printed wiring board, a color filter or a phosphor pattern, etc., further specifically to a negative type light-sensitive lithographic printing plate using a light-sensitive composition.

2. Prior Art

It has been known a conventional light-sensitive resin in which sensitization is carried out by exposing a material to ultraviolet ray, and then, image formation is carried out, and a lithographic printing plate utilizing the light-sensitive resin. In addition to the above, a high sensitivity light-sensitive resin system has been developed, in which a sensitivity to light at visible light region has been markedly improved. In the above system, light sources such as argon ion laser (488 nm) or FD-YAG (532 nm), etc. have been utilized, and an image has directly been drawn by these lasers and a printing plate has been practically made. In these systems, the light-sensitive resin composition comprises a photopolymerization initiator, a dye sensitizer and a polymerizable compound. A photo energy absorbed by the dye sensitizer is utilized for radical cleavage of the photopolymerization initiator and the polymerizable compound is polymerized by the generating radicals.

A high output semiconductor laser or YAG laser which emits at a region of 750 nm or higher has been utilized as a light source for exposure in addition to a visible light laser. Thus, development of a light-sensitive material which uses an output of these light source and a printing plate utilizing the light-sensitive material have been extensively made.

With regard to a specific combination of a photopolymerization initiator and a sensitizer which constitute the above-mentioned photopolymerization system, there may be mentioned, for example, a combination of an organic boron anion and a cationic dye as disclosed in Japanese Provisional Patent Publications No. 143044/1987, No. 150242/1987, No. 5988/1993 and No. 89455/2000. As the other example of the photopolymerization initiator, there may be mentioned a combination of a titanocene compound and a sensitizer as disclosed in Japanese Provisional Patent Publication No. 221110/1988. Moreover, a combination of trihaloalkyl-substituted triazine compound and a cyanine dye has been disclosed in Japanese Provisional Patent Publication No. 189548/1990 and a combination of a hexa-aryl bi-imidazole compound and a dye has been disclosed in Japanese Provisional Patent Publication No. 279903/1989, etc.

However, in the various photopolymerization systems as mentioned above, it is the present status that a sufficient sensitivity has not yet been obtained. Accordingly, it has earnestly been desired to provide a light-sensitive composition which gives a high sensitivity stably. In particular, it has been desired to develop a high sensitivity light-sensitive material which is responsible for various kinds of laser exposure (scanning exposure) and a lithographic printing plate using the same.

Also, as other problem of the light-sensitive composition as mentioned above, when it is applied to, for example, a lithographic printing plate, there is a problem that scumming at a non-image portion is likely caused at the time of printing by preserving with a lapse of time.

On the other hand, there are disclosed that a hindered amine type compound is used as an antioxidant to improve preservation stability of a light-sensitive material as disclosed in Japanese Provisional Patent Publications No. 297364/1996, No. 244233/1997, No. 244234/1997, No. 52575/1999 and No. 214580/2000, etc. However, in the above-mentioned provisional patent publications, the constitution of the present invention is never disclosed and it has never been known that sensitivity can be improved by the combination of the present invention.

SUMMARY OF THE INVENTION

Accordingly, an object of the present invention is to provide a light-sensitive composition having sufficient sensitivity. Another object of the present invention is to provide a light-sensitive composition having high sensitivity which can correspond to scanning exposure such as laser exposure, etc. Still further object of the present invention is to provide a lithographic printing plate having high sensitivity and causing no scumming after preservation for a certain period of time.

The above-mentioned object can be accomplished by a light-sensitive composition comprising a polymer comprising a carboxyl group-containing monomer having a polymerizable double bond at the side chain as a copolymerizable component, an organic borate salt, and a hindered amine type compound or a protonic acid captor.

DESCRIPTION OF THE PREFERRED EMBODIMENTS

As the hindered amine type compound to be used in the present invention, a compound having at least one structural unit represented by the following formula (1) in the molecule can be mentioned as a representative one.

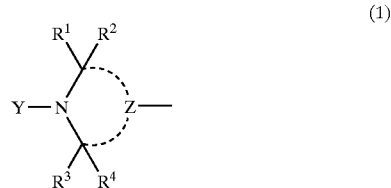

wherein $R^1$, $R^2$, $R^3$ and $R^4$ each represent a hydrogen atom, an alkyl group or an aryl group; Z represents an atomic group necessary for forming a nitrogen-containing aliphatic ring; Y represents a hydrogen atom, an alkyl group or an organic residue; among $R^1$ and $R^2$, or among $R^3$ and $R^4$, one of which may be incorporated into Z and provide a double bond.

Preferred examples of $R^1$ to $R^4$ may include an alkyl group having 1 to 6 carbon atoms. Preferred nitrogen-containing aliphatic ring structure may include piperidine, piperazine, morpholine, pyrrolidine, imidazolidine, oxazolidine, thiazolidine, selenazolidine, pyrroline, imidazoline, isoindoline, tetrahydroisoquinoline, tetrahydropyridine, dihydropyridine, dihydroisoquinoline, oxazoline, thiazoline, selenazoline, pyrrole, etc. Particularly preferred example may include piperidine, piperazine and pyrrolidine. Particularly preferred examples of the hindered amine type compounds having the structural unit represented by the above-mentioned formula (1) are shown below.

(HA-1) 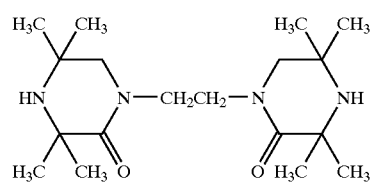
(HA-2) 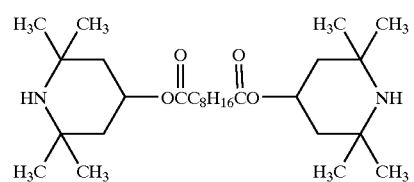
(HA-3) 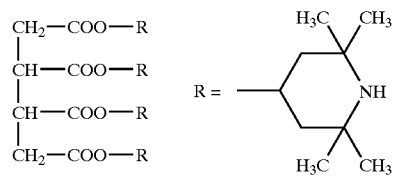
(HA-4) 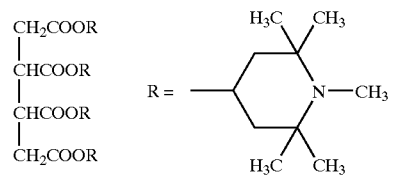
(HA-5) 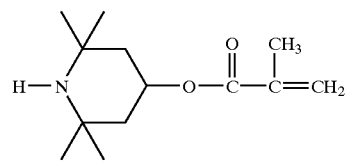
(HA-6) 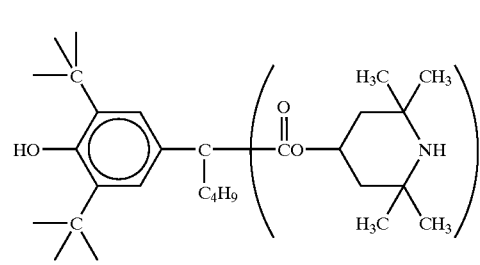
(HA-7) 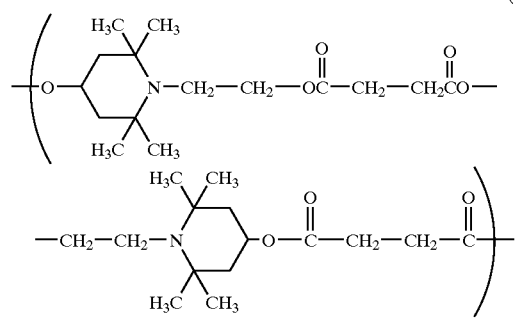
(HA-8) 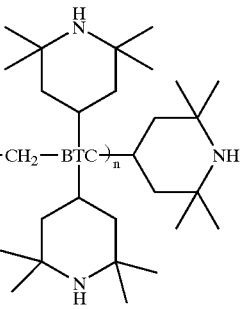
(HA-9)
(HA-10) 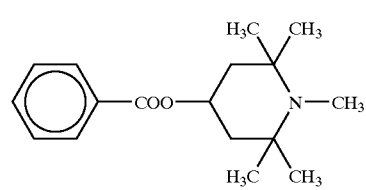
(HA-11) 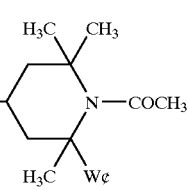

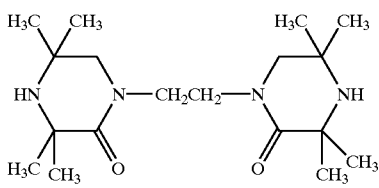

(HA-12)

By the light-sensitive composition which is an objective of the present invention, i.e., by a light-sensitive composition comprising, in combination, a polymer comprising a carboxyl group-containing monomer having a polymerizable double bond at the side chain as a copolymerizable component, an organic borate salt, and a hindered amine type compound or a protonic acid captor, the present inventors have found that a sensitivity of the light-sensitive material is sufficiently improved. Also, by adding the above-mentioned hindered amine type compound, it can be found that a lithographic printing plate having high printing endurance without causing scumming at the time of preservation for a long term can be obtained.

An amount of the hindered amine type compound to be contained in the light-sensitive composition is preferably in the range of 0.1 mg to 500 mg per 1 m² of the light-sensitive material, more preferably in the range of 1 mg to 300 mg per 1 m² of the light-sensitive material.

Another embodiment of the present invention is a light-sensitive composition which comprises a polymer containing a monomer having a polymerizable double bond at the side chain and having a carboxyl group as a copolymer component, an organic borate salt as a photopolymerization initiator and a protonic acid captor in combination.

The protonic acid captor to be used in the present invention is a compound which forms a difficultly soluble salt by combining a protonic acid. There may be mentioned, for example, 3,4-dihydro-2H-pyrido (1,2-a)pyrimidin-2-one and a derivative thereof, and a compound represented by the following formula (2) can be preferably used.

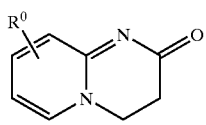

(2)

wherein $R^0$ represents a hydrogen atom, a substituted or unsubstituted alkyl group, a substituted or unsubstituted aryl group, a carboxyamide group, a hydroxyl group or a condensed ring.

Preferred examples of the compound represented by the above formula (2) are shown below.

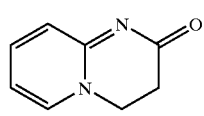

(AC-1)

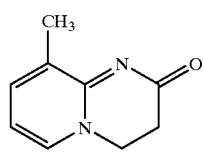

(AC-2)

The compound represented by the above formula (2) is a compound which has been known to be an acid captor or acid scavenger (a protonic acid captor) by bonding to a protonic acid (a Brønsted acid) to form a difficultly soluble salt (see T. Mukaiyama, H. Tada and S. Kobayashi, Chem. Lett., 13, 1976).

In the system of containing an organic borate salt which is a photopolymerization initiator, the present inventor has found that sensitivity and preservation stability of the light-sensitive composition can be improved by adding the above-mentioned protonic acid captor. The mechanism why the preservation stability can be improved by adding the protonic acid captor is not clear, but it can be estimated that the protonic acid captor captures a minor amount of a protonic acid which is capable of generating directly or indirectly (occurrence of an acid via a radical generating in a dark place) during preservation in a dark place by binding to it as a salt whereby decomposition or deformation of the photopolymerization initiator or the sensitizer, etc., by the protonic acid can be prevented.

In the present invention, an organic borate salt is used as a photopolymerization initiator. As the organic borate salt, it is particularly preferred to use a compound having the organic boron anion represented by the following formula (3):

(3)

wherein $R^5$, $R^6$, $R^7$ and $R^8$ each represent an alkyl group, an aryl group, an aralkyl group, an alkenyl group, an alkynyl group, a cycloalkyl group or a heterocyclic group.

Particularly preferred are organic boron anions in which one of $R^5$, $R^6$, $R^7$ and $R^8$ is an alkyl group, and the remaining three are fused aromatic rings, and at least one of the above-mentioned fused aromatic rings has an electron donating substituent. More preferably, it is organic boron anions in which the above-mentioned three fused aromatic rings each have an electron donating substituent. The above-mentioned fused aromatic ring has preferably no electron donating substituent. Even when it has an electron donating substituent, it is important that a substituent constant a value of the Hammett's rule as whole substituents is a negative value.

In the above formula, the fused aromatic ring means a polycyclic aromatic compound in which two or more aromatic rings are integrally bound by having two or more atoms jointly. More specifically, there may be mentioned a naphthalene ring, an anthracene ring, a phenanthrene ring, a pyrene ring, etc. The electron donating substituent means a substituent in which a substituent constant a value when it is substituted at the para-position in the Hammett's rule of a negative value. Such a substituent may preferably include an alkyl group, an aryl group, an alkyloxy group, an alkylamino group, etc., and an optional group(s) may be bonded to these groups.

In the above-mentioned organic boron anion, a cation which forms with the anion simultaneously exists. As the cation in this case, there may be mentioned an alkali metal ion and an onium ion. As the onium ion, there may be mentioned an ammonium, sulfonium, iodonium and phosphonium compound. When a salt of the alkali metal ion, the onium compound and the organic boron anion is used, a sensitizing dye is additionally used to provide sensitivity at a wavelength region of light at which the dye absorbs the light.

As one of the preferred embodiments of the present invention, the light-sensitive composition contains a sensitizing dye which sensitizes the organic borate salt in the wavelength region of 380 nm to 1300 nm. The organic borate salt in this case does not show sensitivity at the wavelength region of from visible ray to infrared ray, and it firstly shows sensitivity at such a wavelength region by addition of the sensitizing dye.

As the organic borate salt in this case, there may be used a salt containing an organic boron anion represented by the above-mentioned formula (3), and as the cation to form the salt, an alkali metal ion and an onium compound are preferably used. Particularly preferred examples of the onium salt with the organic boron anion may include an ammonium salt such as tetraalkyl ammonium salt, etc.; a sulfonium salt such as triaryl sulfonium salt, etc.; a phosphonium salt such as triarylalkyl phosphonium salt, etc. In the following, examples of the organic borate salt to be used in the present invention are mentioned.

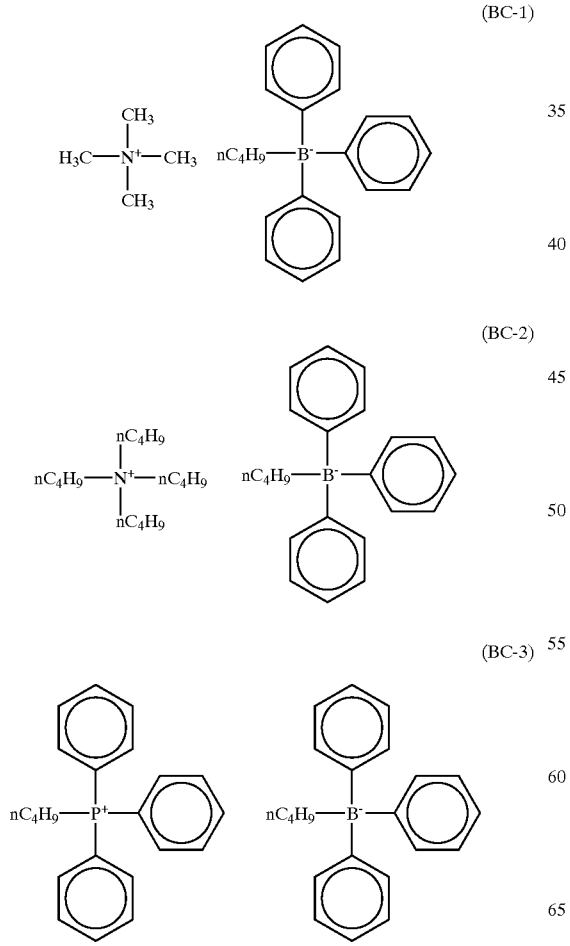

(BC-1)

(BC-2)

(BC-3)

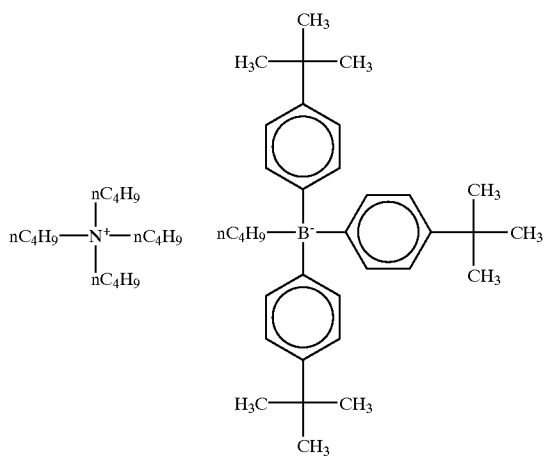

(BC-4)

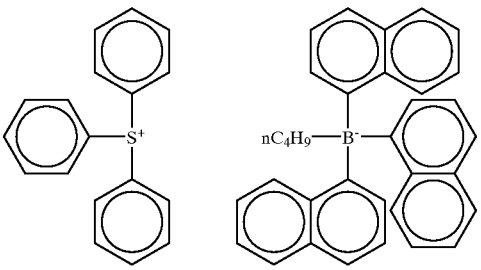

(BC-5)

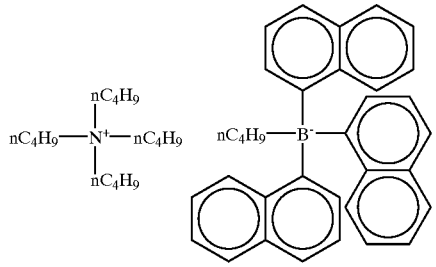

(BC-6)

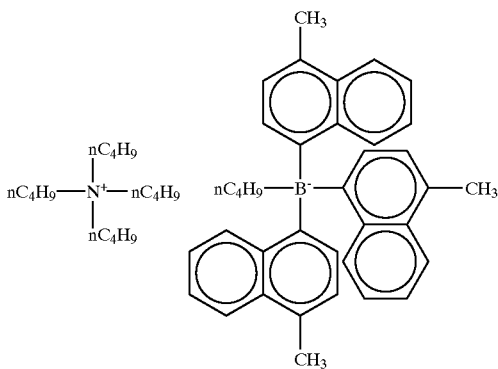

(BC-7)

(BC-8)
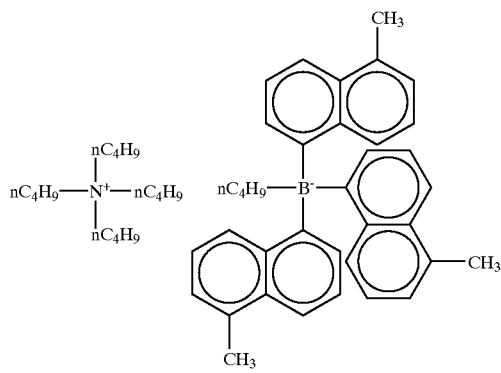

(BC-9)
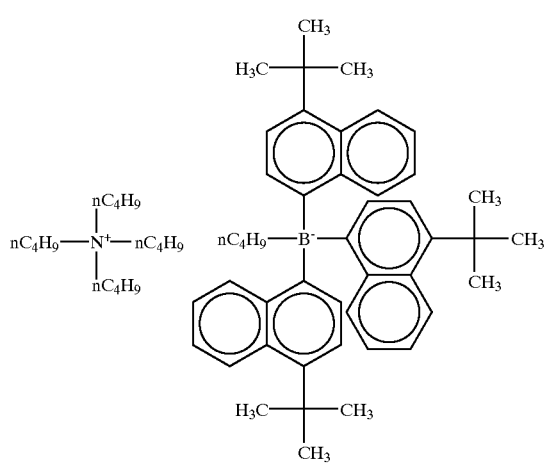

(BC-10)
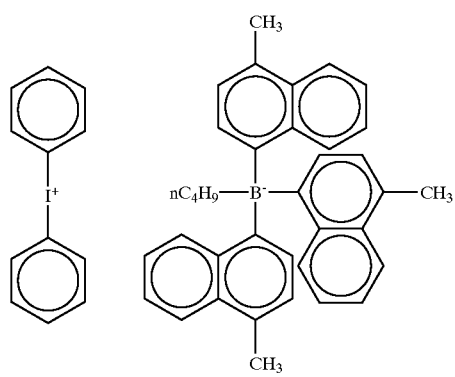

(BC-11)
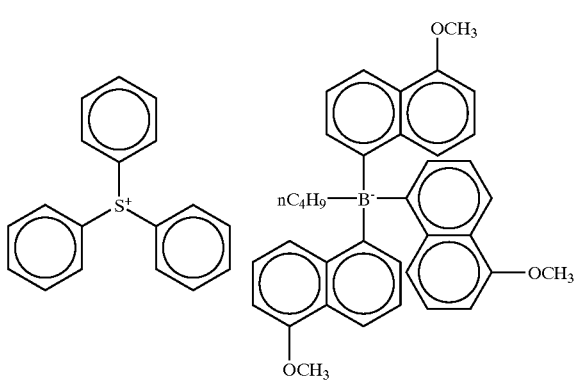

(BC-12)
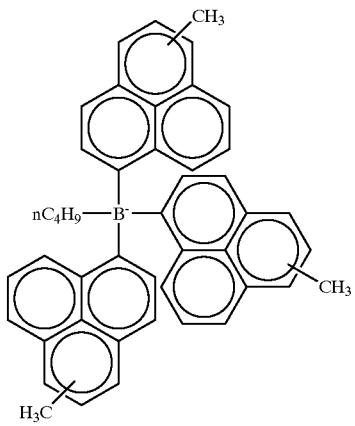

A ratio of the organic borate salt to be contained in the light-sensitive composition is preferably in the range of 0.1 part by weight to 50 parts by weight based on 100 parts by weight in total of the light-sensitive composition.

In the light-sensitive composition of the present invention, a trihaloalkyl substituted compound is preferably used in combination with the above-mentioned organic boron compound as the photopolymerization initiators. By using these compounds in combination, sensitivity can be further heightened. As the trihaloalkyl substituted compound, there may be specifically mentioned a compound which has at least one trihaloalkyl group in the molecule, such as a trichloromethyl group, a tribromomethyl group, etc. Preferred examples thereof may include a s-triazine derivative, an oxazole derivative, and a trihaloalkylsulfonyl compound in which said trihaloalkyl group is bonded to an aromatic ring or a nitrogen-containing heterocyclic ring through a sulfonyl group.

Particularly preferred examples of the nitrogen-containing heterocyclic compound having a trihaloalkyl group or the trihaloalkylsulfonyl compound are mentioned below.

(T-1)
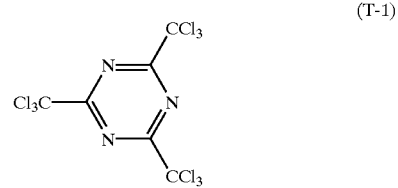

(T-2)
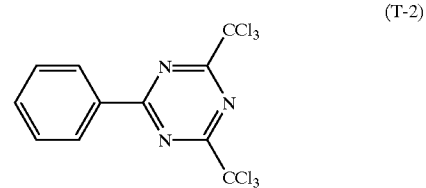

(T-3)
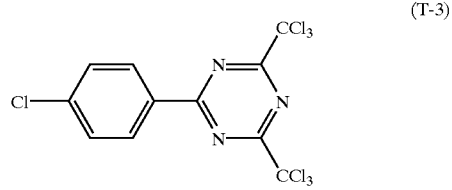

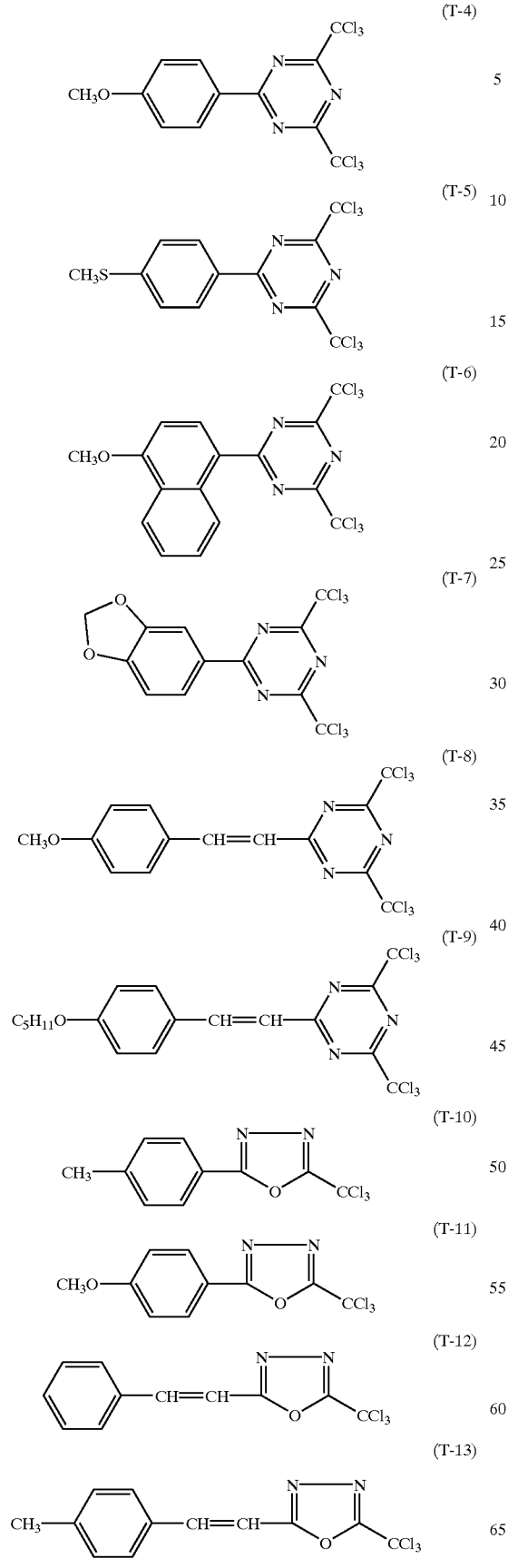
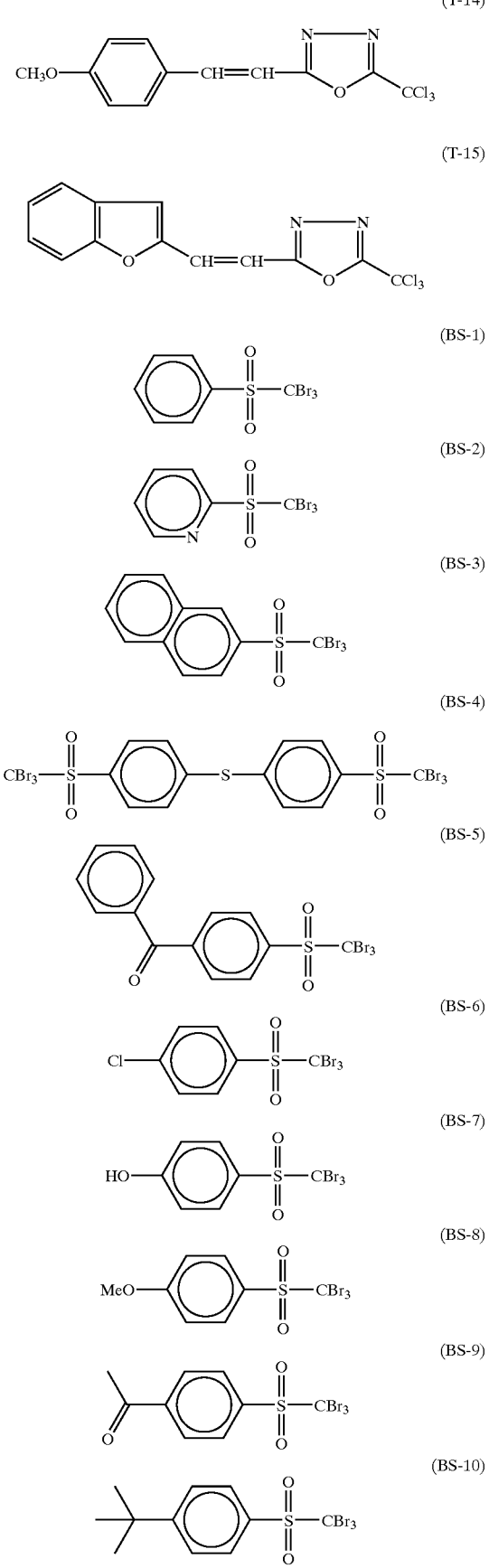

When the above-mentioned trihaloalkyl-substituted compound is additionally used, a ratio of the compound to the organic borate salt is preferably within the range of 0.1 part by weight to 50 parts by weight based on 1 part by weight of the organic borate salt.

With regard to the sensitizing dye according to the present invention, it sensitizes decomposition of the photopolymerization initiator at the wavelength region of 380 nm to 1300 nm. As various kinds of cationic dyes, anionic dyes and neutral dyes having no charge, merocyanine, coumalin, xanthene, thioxanthene, azo dyes, etc. maybe used. Of these, particularly preferred examples are selected from, as the cationic dyes, cyanine, carbocyanine, hemicyanine, methyne, polymethyne, triarylmethane, indoline, azine, thiazine, xanthene, oxazine, acridine, rhodamine, and azamethyne dyes. By using these cationic dyes in combination, particularly high sensitivity and excellent preservation property can be obtained. Moreover, in recent years, it has been developed an output machine (a plate setter) mounting a violet semiconductor laser which has an oscillation wavelength in the range of 380 to 410 nm. As a light-sensitive system to which the output system mentioned above can be applied, a system containing a pyrylium series compound or thiopyrylium series compound is preferably used. Preferred examples of the sensitizing dyes according to the present invention will be mentioned in the following.

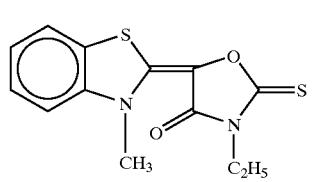
(S-1)

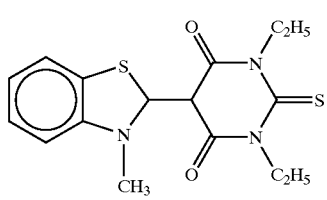
(S-2)

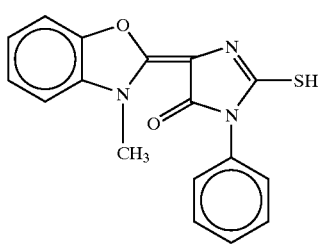
(S-3)

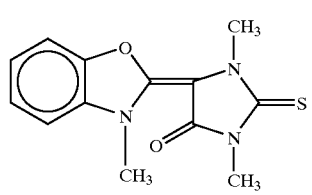
(S-4)

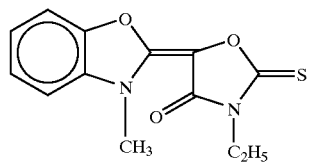
(S-5)

-continued

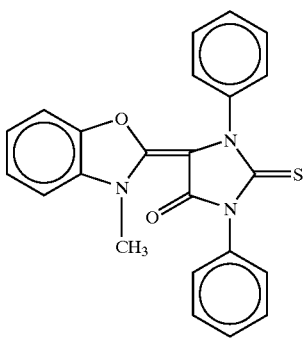
(S-6)

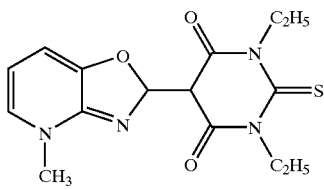
(S-7)

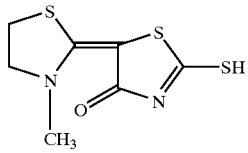
(S-8)

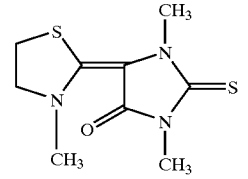
(S-9)

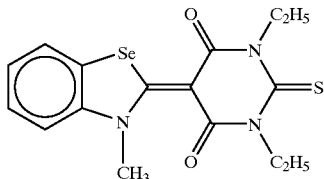
(S-10)

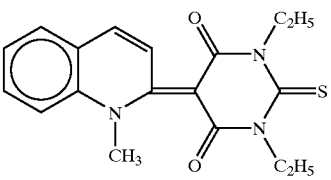
(S-11)

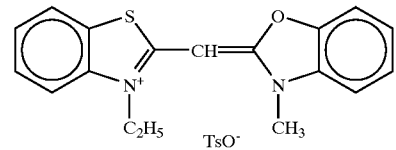
(S-12)

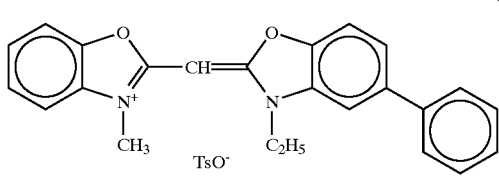
(S-13)

-continued
(S-14) 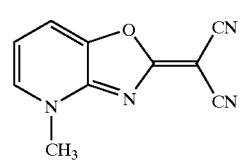
(S-15) 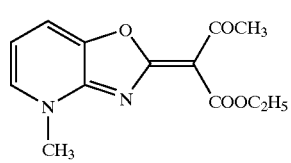
(S-16) 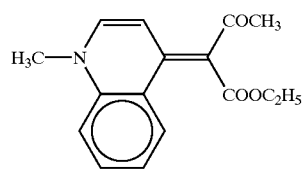
(S-17) 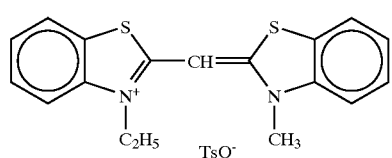
(S-18) 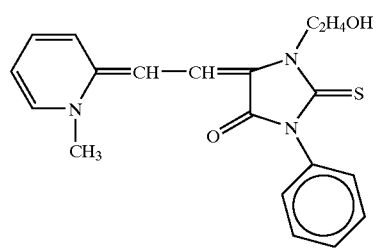
(S-19) 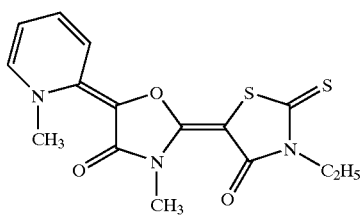
(S-20) 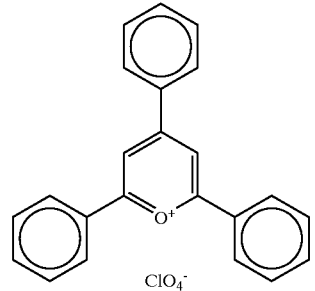
-continued
(S-21) 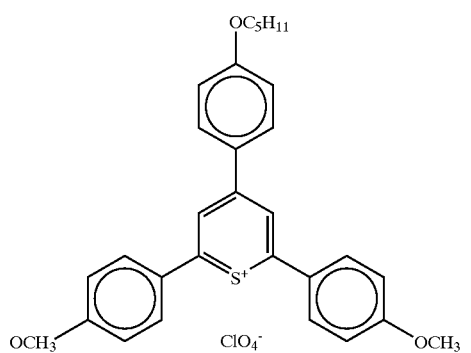
(S-22) 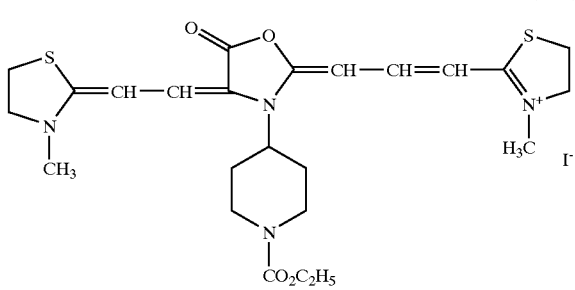
(S-23) 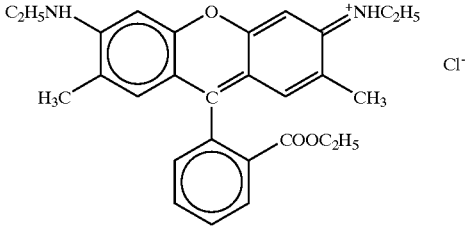
(S-24) 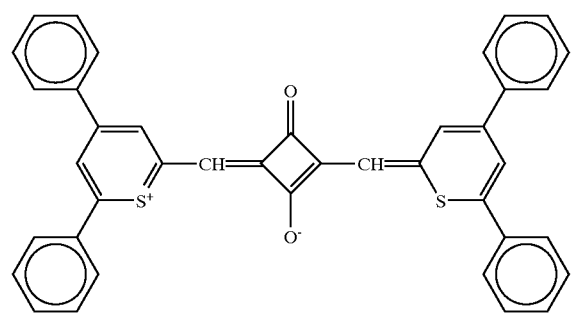
(S-25) 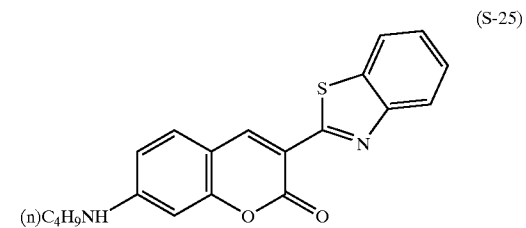

-continued
(S-26)
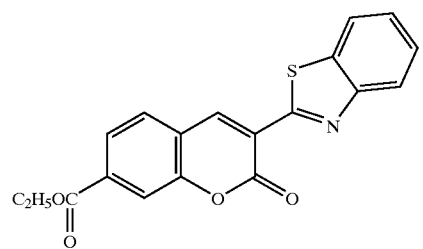
(S-27)
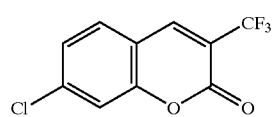
(S-28)
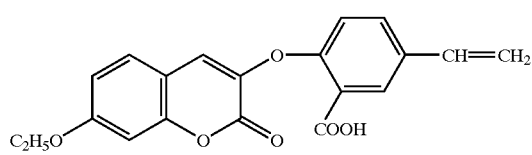
-continued
(S-29)
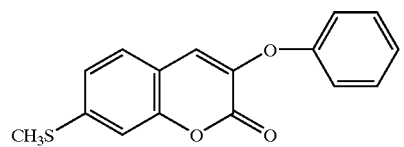
(S-30)
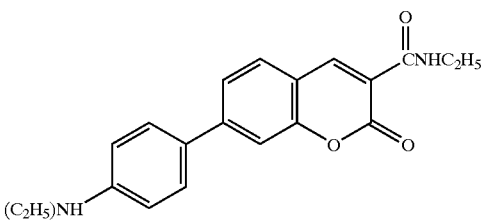
In particular, in a system which provides a high sensitivity to light at the wavelength region of near-infrared of 750 nm or more to infrared light which is one of the problems of the present invention, the following compounds are preferably used as a sensitizing dye.
(S-31)
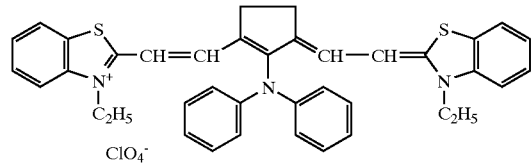
(S-32)
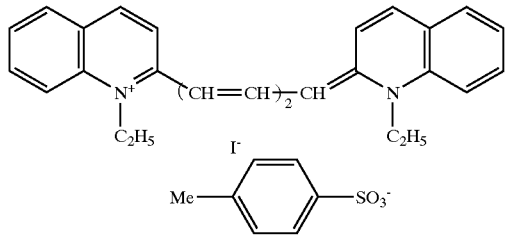
(S-33)
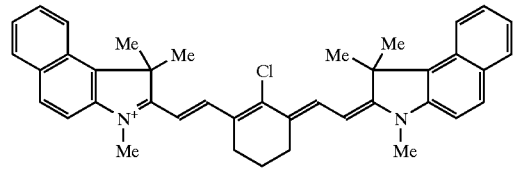
(S-34)
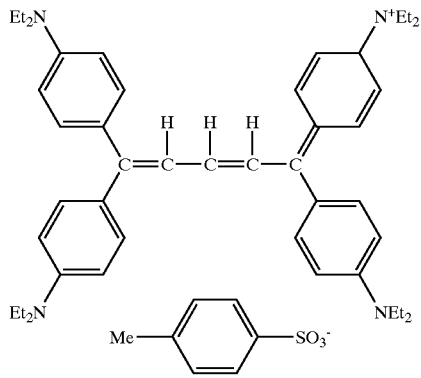
(S-35)
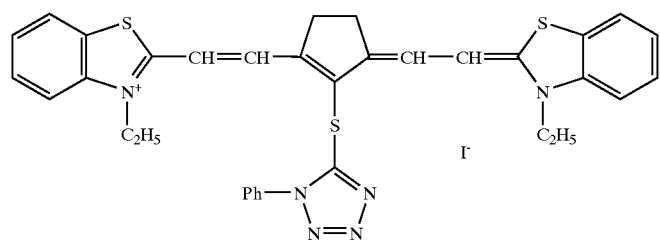

-continued
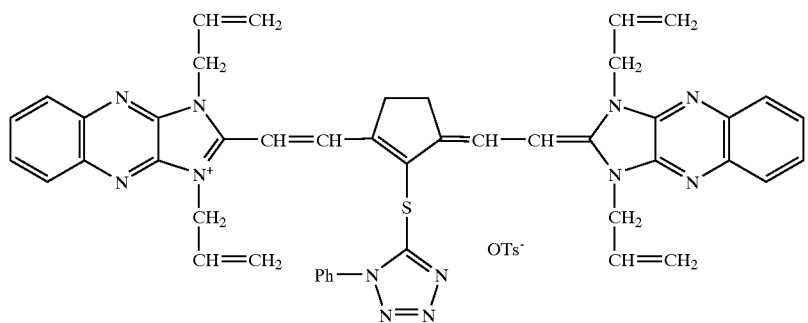
(S-36)
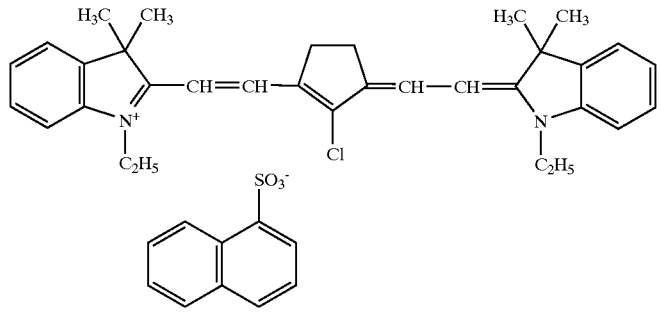
(S-37)
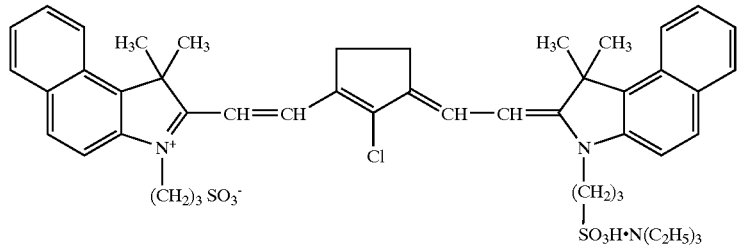
(S-38)
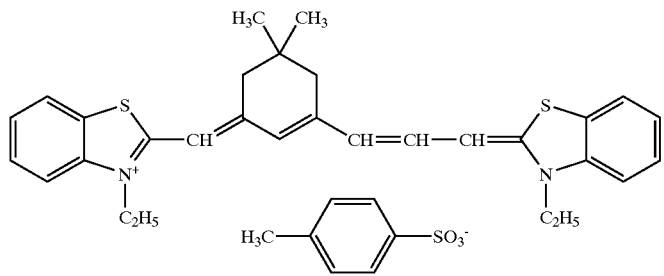
(S-39)
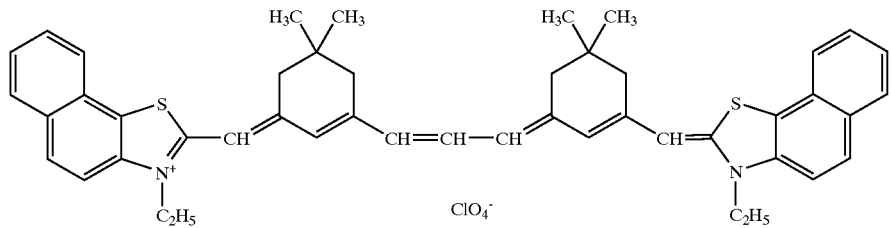
(S-40)

-continued (S-41)
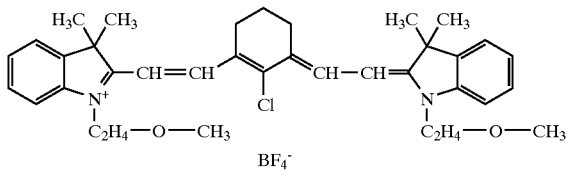

(S-42)
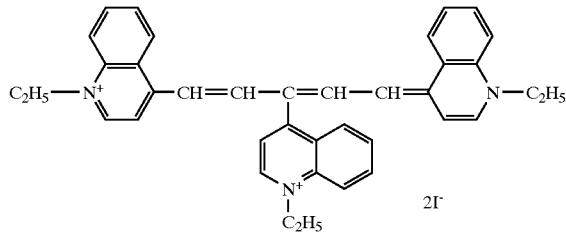

(S-43)
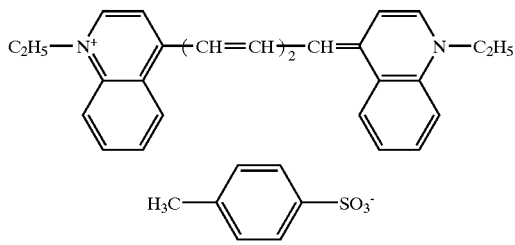

(S-44)
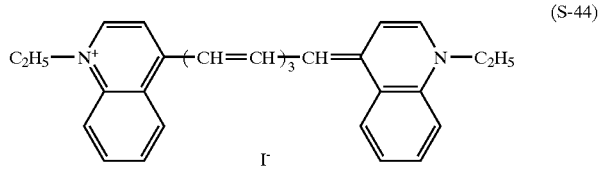

With regard to a formulation ratio of the above-mentioned sensitizing dye and the photopolymerization initiator to be used in the present invention, it is preferred to use the photopolymerization initiator in the range of 0.01 part by weight to 100 parts by weight, more preferably in the range of 0.1 part by weight to 50 parts by weight based on 1 part by weight of the sensitizing dye.

In the present invention, a polymer comprising a monomer having a polymerizable double bond at a side chain and having a carboxyl group as a copolymer component is used as a polymer binder. Said polymer is a polymer which has a polymerizable double bond and a carboxyl group in a recurring unit. Also, said polymer is preferably an alkali-soluble polymer. In this case, a ratio of the carboxyl group-containing monomer contained in the copolymer composition is preferably 5% by weight or more to 99% by weight or less based on the total compositional amount of 100% by weight. If it is less than the above range, the copolymer may not sometimes be dissolved in an aqueous alkaline solution. The ratio of the carboxyl group-containing monomer contained in the copolymer composition is more preferably 10% by weight or more to 80% by weight or less, particularly preferably 20% by weight or more to 70% by weight or less based on the total compositional amount of 100% by weight. Also, a ratio of the monomer having a polymerizable double bond contained in the copolymer component is preferably 1% by weight or more to 95% by weight or less, more preferably 10% by weight or more to 80% by weight or less, particularly preferably 20% by weight or more to 75% by weight or less based on the total compositional amount of 100% by weight.

As the above-mentioned carboxyl group-containing monomer, there may be mentioned, for example, acrylic acid, methacrylic acid, 2-carboxyethyl acrylate, 2-carboxyethyl methacrylate, chrotonic acid, maleic acid, fumaric acid, monoalkyl maleate, monoalkyl fumarate, 4-carboxystyrene, etc.

When a polymer into which a polymerizable double bond is introduced at the side chain of the alkali-soluble polymer having a carboxyl group is used, it is possible to provide a negative type light-sensitive material having a high sensitivity in the combination of the above-mentioned organic borate salt and the hindered amine type compound or the protonic acid captor. Also, the sensitizing dye is further added to the above material, it is possible to realize high sensitization with a wide wavelength range, so that the material can be used for a scanning type exposure using various kinds of laser light. As the monomer for introducing a polymerizable double bond into the polymer side chain there may be mentioned allyl acrylate, allyl methacrylate, vinyl acrylate, vinyl methacrylate, 1-propenyl acrylate, 1-propenyl methacrylate, β-phenylvinyl acrylate, β-phenylvinyl methacrylate, vinyl acrylamide, vinyl methacrylamide, α-chlorovinyl acrylate, α-chlorovinyl methacrylate, β-methoxyvinyl acrylate, β-methoxyvinyl methacrylate, vinylthio acrylate, vinylthio methacrylate, etc.

As the polymer to be used in the present invention, particularly preferred is a polymer which has a vinyl group-substituted phenyl group at the side chain and contains a carboxyl group-containing monomer as a copolymer component. The phenyl group to which a vinyl group is substituted is directly bonded to a main chain or bonded via a connecting group, and the connecting group is not particularly limited, which may include an optional group, an atom or a complex group in which the group and the atom are bonded. Also, the phenyl group may be substituted by a group or an atom which can be substitutable, and the above-mentioned vinyl group may be substituted by a halogen atom, a carboxyl group, a sulfo group, a nitro group, a cyano group, an amide group, an amino group, an alkyl group, an aryl group, an alkoxy group, an aryloxy group, etc. The polymer having a vinyl group-substituted phenyl group at the side chain is those having a group represented by the following formula (4) at the side chain.

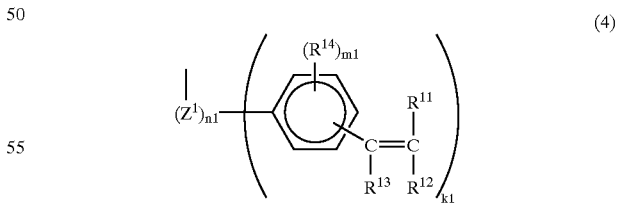

(4)

wherein $Z^1$ represents a linking group; $R^{11}$, $R^{12}$ and $R^{13}$ each represent a hydrogen atom, a halogen atom, a carboxyl group, a sulfo group, a nitro group, a cyano group, an amide group, an amino group, an alkyl group, an aryl group, an alkoxy group or an aryloxy group; $R^{14}$ is a substitutable group or atom; $n_1$ is 0 or 1; $m_1$ is an integer of 0 to 4; and $k_1$ is an integer of 1 to 4.

The above-mentioned formula (4) will be explained in more detail. As the linking group of $Z^1$, there may be mentioned an oxygen atom, a sulfur atom, an alkylene group, an alkenylene group, an arylene group, —N(R$^{15}$)—, —C(O)—O—, —C(R$^{16}$)=N—, —C(O)—, a sulfonyl group, a heterocyclic group, and a group represented by the following formula (5), etc., which are alone or a complex group in which the above-mentioned groups are combined. Here, R$^{15}$ and R$^{16}$ each represent a hydrogen atom, an alkyl group, an aryl group, etc. Moreover, to the above-mentioned connecting group, a substituent such as an alkyl group, an aryl group, a halogen atom, etc. may be bonded.

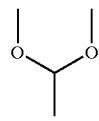

(5)

As the above-mentioned heterocyclic group, there may be mentioned, for example, a nitrogen-containing heterocyclic ring such as a pyrrole ring, a pyrazole ring, an imidazole ring, a triazole ring, a tetrazole ring, an isoxazole ring, an oxazole ring, an oxadiazole ring, an isothiazole ring, a thiazole ring, a thiadiazole ring, a thiatriazole ring, an indole ring, an indazole ring, a benzimidazole ring, a benzotriazole ring, a benzoxazole ring, a benzothiazole ring, a benzoselenazole ring, a benzothiadiazole ring, a pyridine ring, a pyridazine ring, a pyrimidine ring, a pyrazine ring, a triazine ring, a quinoline ring, a quinoxaline ring, etc.; a furan ring, a thiophene ring, etc., and these heterocyclic ring may be substituted by a substituent(s).

Examples of the groups represented by the above formula (4) are mentioned below, but the present invention is not limited by these examples.

(K-1)

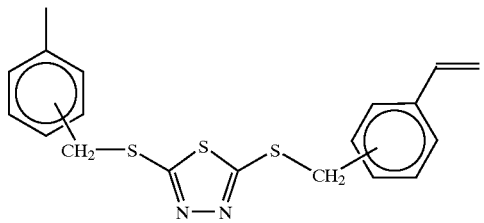

(K-2)

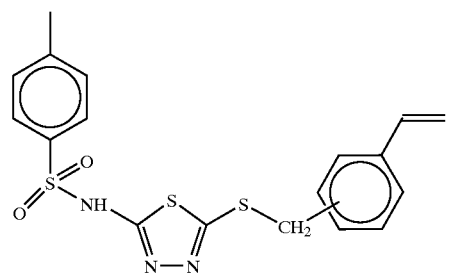

(K-3)

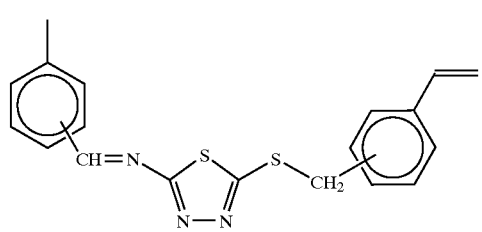

(K-4)

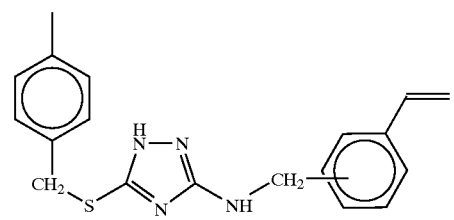

(K-5)

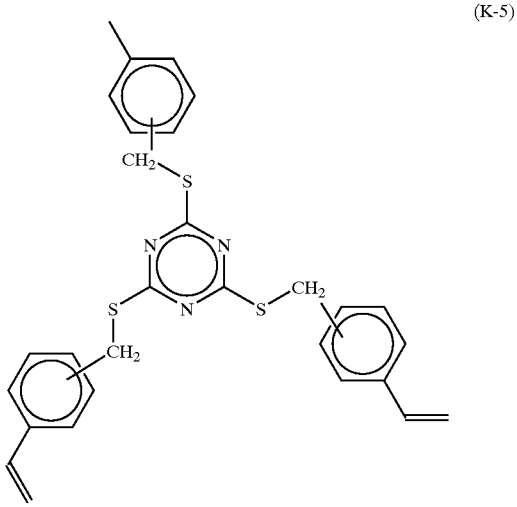

(K-6)

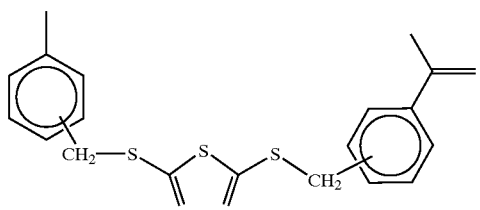

(K-7)

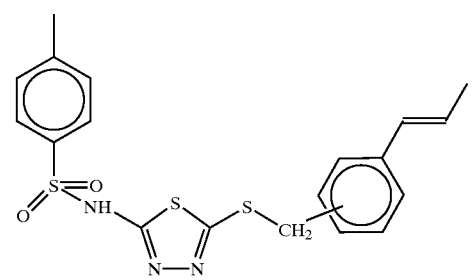

(K-8)

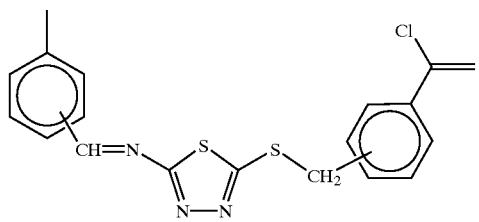

(K-9)

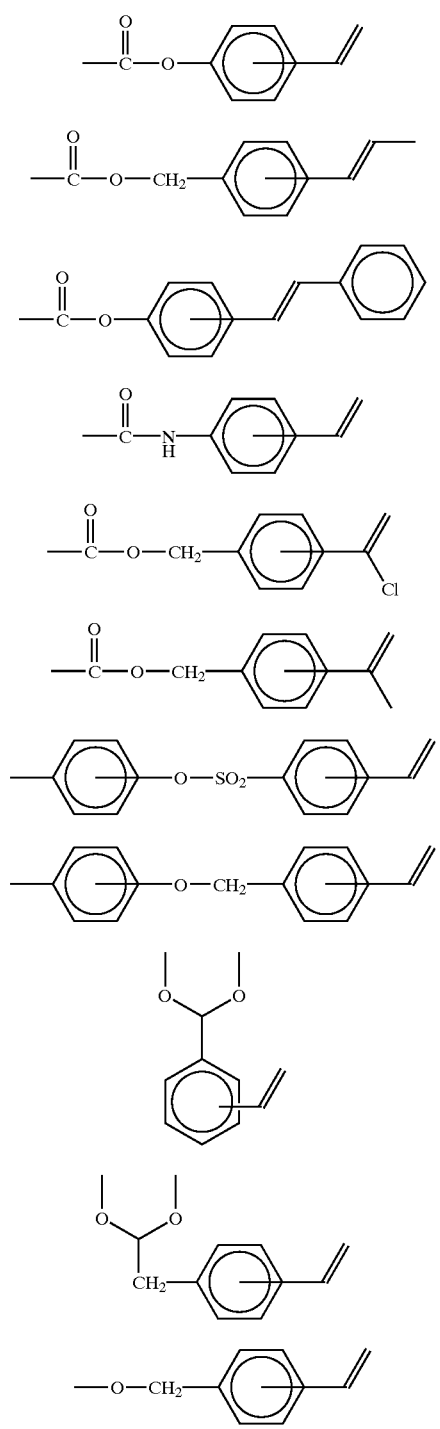

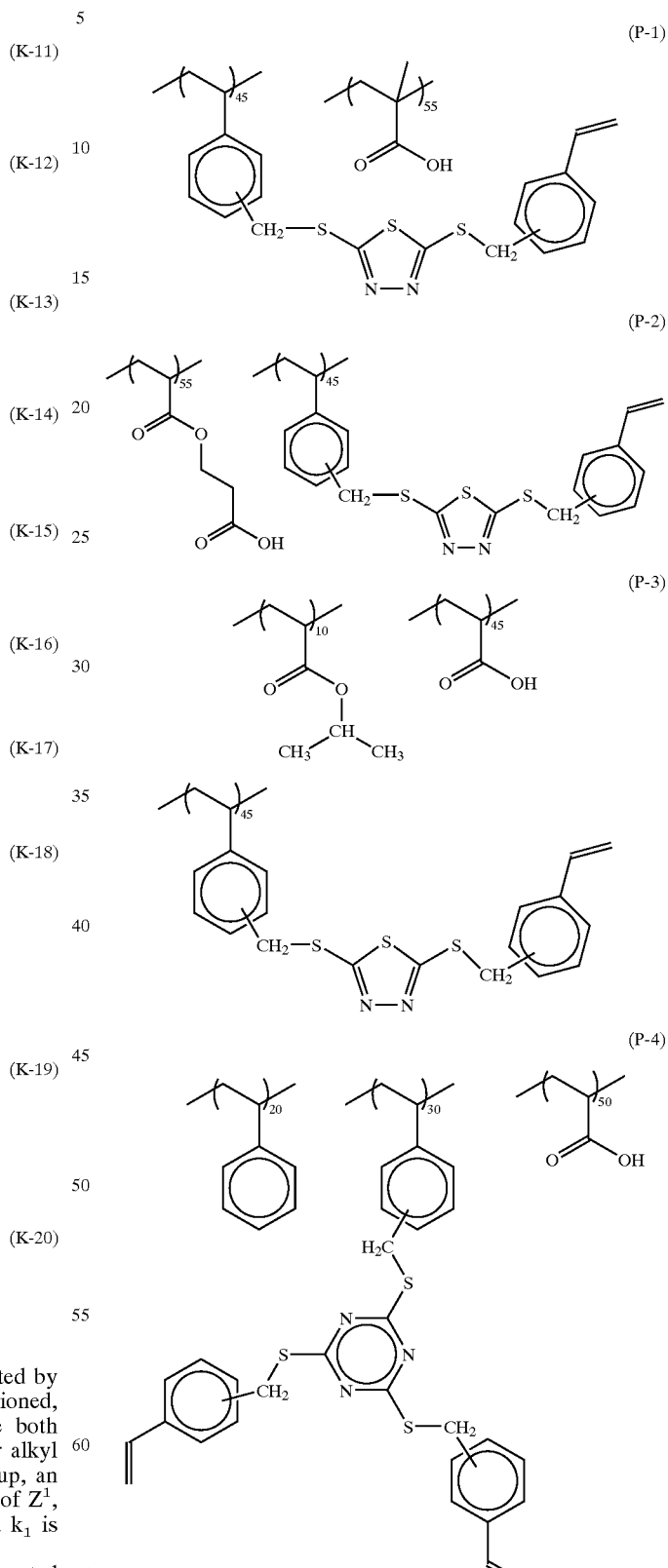

component are shown below. In the formulae, the numerals mean % by weight of the respective recurring unit in the total composition of the copolymer as 100% by weight.

As the preferred examples of the groups represented by the above-mentioned formula (4), there may be mentioned, for example, the group wherein $R^{11}$ and $R^{12}$ are both hydrogen atoms, $R^{13}$ is a hydrogen atom or a lower alkyl group having 4 or less carbon atoms (a methyl group, an ethyl group, etc.). Moreover, as a connecting group of $Z^1$, that containing a heterocyclic ring is preferred, and $k_1$ is preferably 1 or 2.

Examples of the polymers having the group represented by the above-mentioned formula (4) and containing a carboxyl group-containing monomer as a copolymerizable

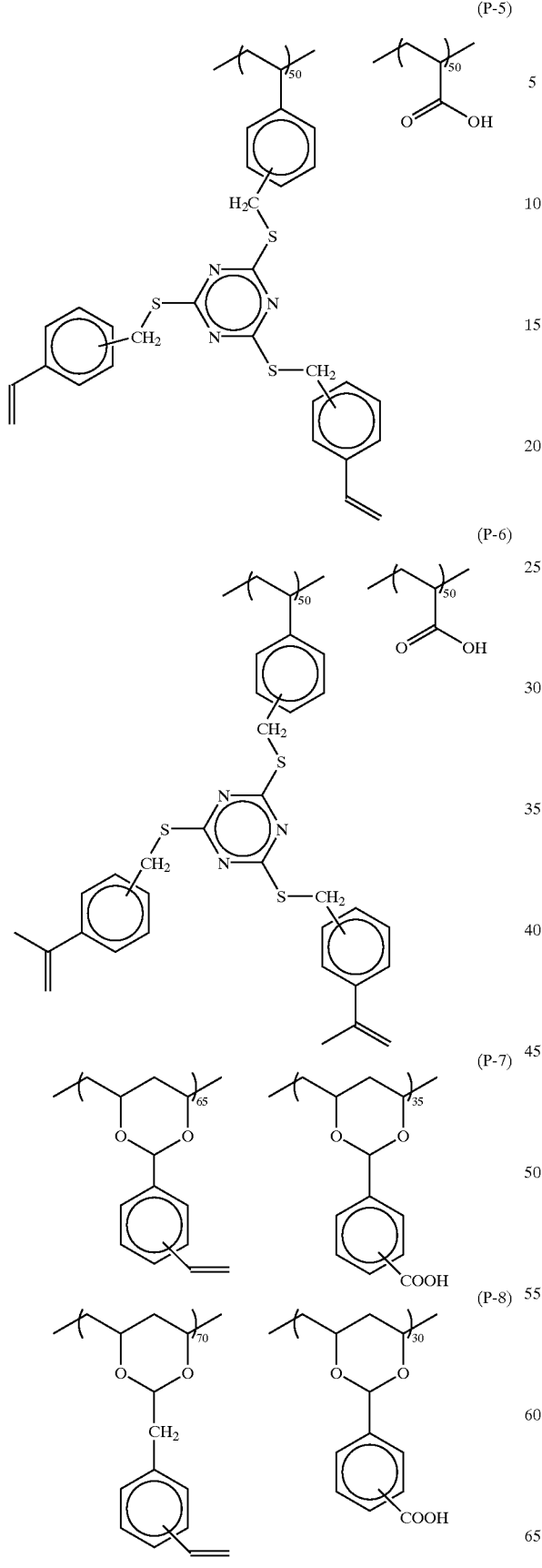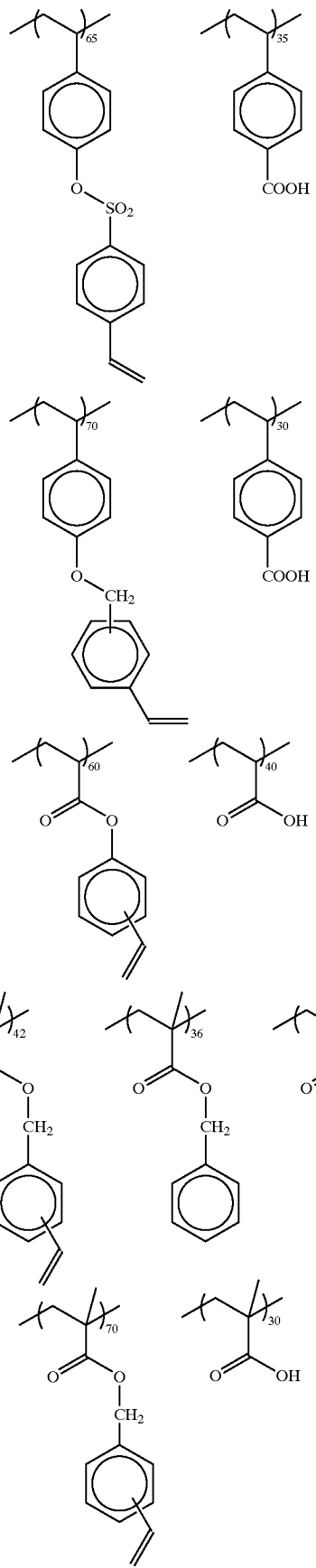

The polymer of the present invention may further contain other monomer as a copolymer component(s). As the other monomer, there may be mentioned, for example, styrene derivatives such as styrene, 4-methylstyrene, 4-hydroxystyrene, 4-acetoxystyrene, 4-carboxystyrene, 4-aminostyrene, chloromethylstyrene, 4-methoxystyrene, etc.; alkyl methacrylates such as methyl methacrylate, ethyl methacrylate, butyl methacrylate, hexyl methacrylate, 2-ethylhexyl methacrylate, cyclohexyl methacrylate, dodecyl methacrylate, etc.; aryl methacrylates or alkylaryl methacrylates such as phenyl methacrylate, benzyl methacrylate, etc.; methacrylates having an alkyleneoxy group such as 2-hydroxyethyl methacrylate, 2-hydroxypropyl methacrylate, methoxydiethylene glycol monoester methacrylate, methoxypolyethylene glycol monoester methacrylate, polypropylene glycol monoester methacrylate, etc.; methacrylates containing an amino group such as 2-dimethylaminoethyl methacrylate, 2-diethylaminoethyl methacrylate, etc.; or acrylates corresponding to the above methacrylates, monomers having a phosphoric acid group such as vinyl phosphonic acid, etc.; monomers having an amino group such as allyl amine, diallyl amine, etc.; monomers having a sulfonic acid group such as vinyl sulfonic acid and a salt thereof, allyl sulfonic acid and a salt thereof, metallyl sulfonic acid and a salt thereof, styrene sulfonic acid and a salt thereof, 2-acrylamide-2-methylpropane sulfonic acid and a salt thereof, etc.; monomers having a nitrogen-containing heterocyclic ring such as 4-vinypyridine, 2-vinylpyridine, N-vinylimidazole, N-vinylcarbazole, etc., monomers having a quaternary ammonium salt group such as 4-vinylbenzyltrimethyl ammonium chloride, acryloyloxyethyltrimethyl ammonium chloride, methacryloyloxyethyltrimethyl ammonium chloride, quaternized product of dimethylaminopropyl acrylamide by methyl chloride, quaternized product of N-vinylimidazole by methyl chloride, 4-vinylbenzyl pyridinium chloride, etc.; acrylonitrile, methacrylonitrile; acrylamide or methacrylamide derivatives such as acrylamide, methacrylamide, dimethyl acrylamide, diethyl acrylamide, N-isopropyl acrylamide, diacetone acrylamide, N-methylol acrylamide, N-methoxyethyl acrylamide, 4-hydroxyphenyl acrylamide, etc.; phenyl maleimide, hydroxyphenyl maleimide; vinyl esters such as vinyl acetate, vinyl chloroacetate, vinyl propionate, vinyl butyrate, vinyl stearate, vinyl benzoate, etc.; vinyl ethers such as methyl vinyl ether, butyl vinyl ether, etc.; and other monomers such as N-vinylpyrrolidone, acryloyl morpholine, tetrahydro-furfuryl methacrylate, vinyl chloride, vinylidene chloride, allyl alcohol, vinyl trimethoxysilane, glycidyl methacrylate, glycidyl acrylate, etc.

With regard to the molecular weight of the polymer according to the present invention, it is preferably in the range of 1,000 to 1,000,000 in terms of a weight average molecular weight, more preferably in the range of 5,000 to 500,000.

When the polymer of the present invention as mentioned above and the hindered amine type compound or the protonic acid captor are mixed in a solution, it sometimes causes a difficultly soluble salt to form a precipitate. A preferred formulation ratio of these components in the present invention is that the hindered amine type compound or the protonic acid captor is used in an amount of 0.0001 part by weight to 0.5 part by weight based on 1 part by weight of the polymer, more preferably in the range of 0.001 part by weight to 0.3 part by weight. In the formulation ratio of these components, when the respective concentrated solutions thereof are used and mixed to each other, a complex salt which is difficultly soluble in an organic solvent(s) is sometimes formed, so that it may not be used as a coating solution. However, by adding an alcohol solvent such as methanol, ethanol, etc. to the mixed solution, it is easily possible to prepare a mixed solution uniformly dissolved therein. The thus prepared mixed solution can be used as a coating solution by further adding an additive(s), if necessary. A light-sensitive layer prepared by coating the coating solution and drying has good resistance to various kinds of organic solvents, while it has good developability to an alkaline developer. Thus, it is one of the characteristic features of the present invention that, particularly when it is used as a lithographic printing plate, a negative type printing plate in which an image portion has excellent resistance to various kinds of organic solvents can be obtained.

The light-sensitive composition of the present invention preferably further contains an ethylenically unsaturated compound. By using the compound in combination, higher sensitivity can be realized and a lithographic printing plate excellent in printing characteristics can be obtained.

As the ethylenically unsaturated compound to be used in the present invention, there may be mentioned a polymerizable compound having two or more polymerizable double bonds in the molecule. This polymerizable compound may preferably be a monomer or an oligomer, and a molecular weight thereof is preferably 10,000 or less, more preferably 5,000 or less. Examples of the preferred ethylenically unsaturated compound may include polyfunctional acrylate series monomers such as 1,4-butanediol diacrylate, 1,6-hexanediol diacrylate, neopentylglycol diacrylate, tetraethyleneglycol diacrylate, trisacryloyloxyethyl isocyanurate, tripropylene glycol diacrylate, ethylene glycol glycerol triacrylate, glycerol epoxy triacrylate, trimethylolpropane triacrylate, pentaerythritol triacrylate, pentaerythritol tetraacrylate, etc., and polyfunctional methacrylate series monomers corresponding to the above-mentioned acrylates.

Or else, in place of the above-mentioned polymerizable compounds, an oligomer having radical polymerizability such as various kinds of oligomers into which an acryloyl group or a methacryloyl group is introduced may be used. Examples of which may include an ethylenically unsaturated compound such as polyester (meth) acrylate, urethane (meth) acrylate, epoxy (meth) acrylate, etc.

As the ethylenically unsaturated compound, a polymerizable compound having two or more phenyl groups, each of which is substituted by a vinyl group in the molecule, may be mentioned as a further preferred embodiment. When such a compound is used, cross-linking is effectively carried out by recombination of styryl radicals formed by generating radicals, so that it is particularly preferred to form a negative-type light-sensitive material having high sensitivity.

The polymerizable compound having two or more phenyl groups, each of which is substituted by a vinyl group in the molecule, is represented by the following formula (6):

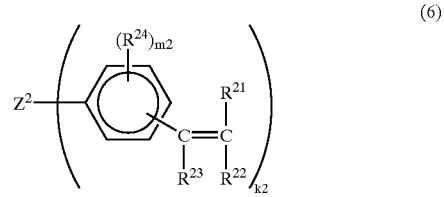

(6)

wherein $Z^2$ represents a linking group; $R^{21}$, $R^{22}$ and $R^{23}$ each represent a hydrogen atom, a halogen atom, a carboxyl group, a sulfo group, a nitro group, a cyano group, an amide group, an amino group, an alkyl group, an aryl group, an alkoxy group, or an aryloxy group, each of the groups maybe further substituted by an alkyl group, an amino group, an aryl group, an alkenyl group, a carboxyl group, a sulfo group, a hydroxyl group or the like; $R^{24}$ is a substitutable group or atom; $m_2$ is an integer of 0 to 4; and $k_2$ is an integer of 2 or more.

The formula (6) is further explained in more detail. As the linking group $Z^2$, there maybe mentioned an oxygen atom, a sulfur atom, an alkylene group, an arylene group, —N($R^{25}$)—, —C(O)—O—, —C($R^{26}$)=N—, —C(O)—, a sulfonyl group, a heterocyclic ring group, etc., which may be alone or two or more thereof are combined to each other. Here, $R^{25}$ and $R^{26}$ each represent a hydrogen atom, an alkyl group, an aryl group, etc. Moreover, to the above-mentioned linking group, an alkyl group, an aryl group, a halogen atom, etc., may be substituted.

As the above-mentioned heterocyclic ring group, there may be mentioned nitrogen-containing heterocyclic rings such as a pyrrole ring, a pyrazole ring, an imidazole ring, a triazole ring, a tetrazole ring, an isoxazole ring, an oxazole ring, an oxadiazole ring, an isothiazole ring, a thiazole ring, a thiadiazole ring, a thiatriazole ring, an indole ring, an indazole ring, a benzimidazole ring, a benzotriazole ring, a benzoxazole ring, a benzothiazole ring, a benzoselenazole ring, a benzothiadiazole ring, a pyridine ring, a pyridazine ring, a pyrimidine ring, a pyrazine ring, a triazine ring, a quinoline ring, a quinoxaline ring, etc.; a furan ring, a thiophene ring, etc., each of which may be substituted by any substituent(s).

Of the compound represented by the above-mentioned formula (6), preferred compounds are those in which $R^{21}$ and $R^{22}$ are both hydrogen atoms, $R^{23}$ is a hydrogen atom or a lower alkyl group having 4 or less carbon atoms (a methyl group, an ethyl group, etc.), and $k_2$ is an integer of 2 to 10. In the following, specific examples of the compound represented by the formula (6) are mentioned, but the present invention is not limited by these examples.

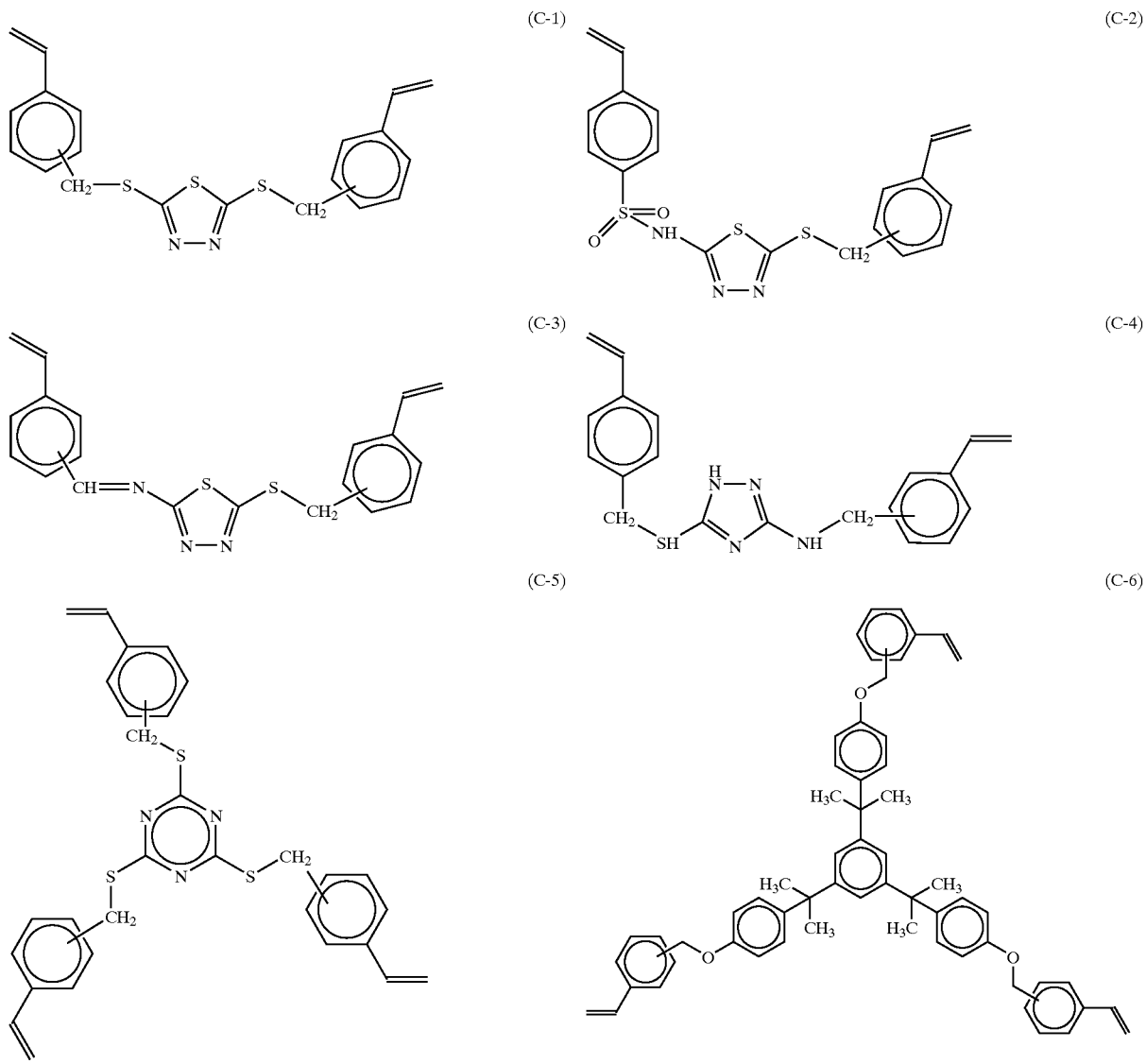

-continued
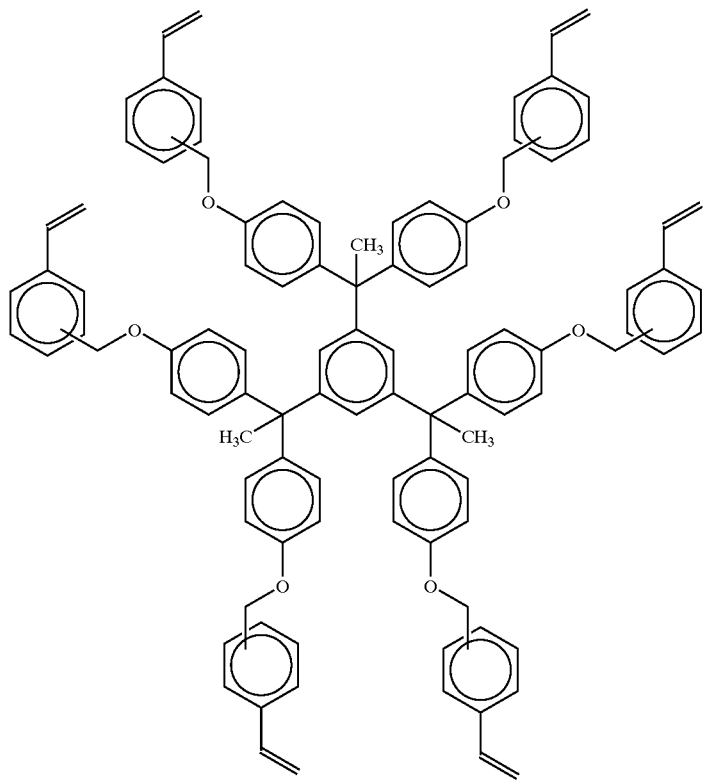
(C-7)
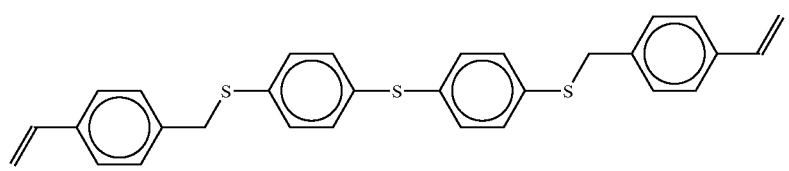
(C-8)
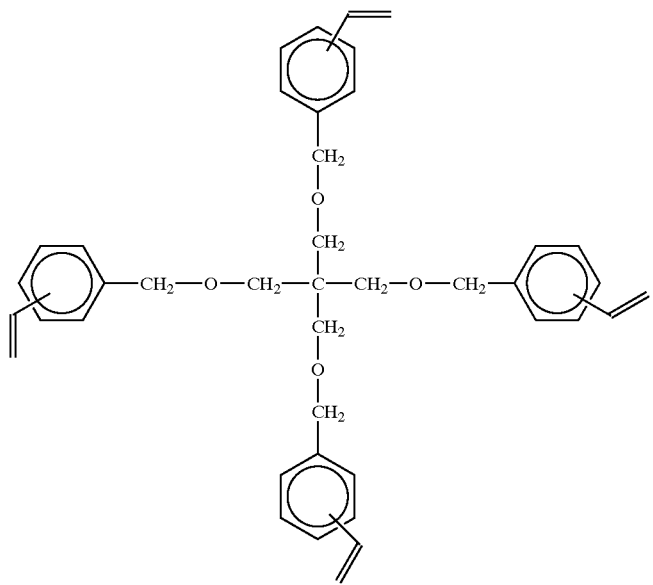
(C-9)

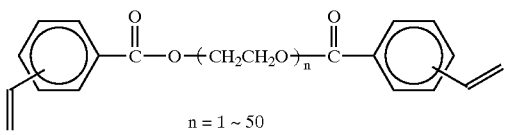

(C-10)

n = 1 ~ 50

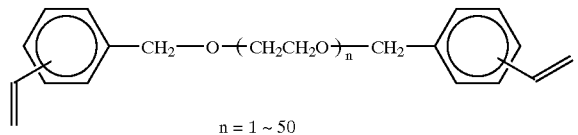

(C-11)

n = 1 ~ 50

An amount of the above-mentioned ethylenically unsaturated compound to be contained in the light-sensitive composition is preferably in the range of 1 part by weight to 60 parts by weight based on 100 parts by weight of the light-sensitive composition, particularly preferably in the range of 5 parts by weight to 50 parts by weight based on the same.

In the light-sensitive composition in which a photopolymerization initiator, a sensitizing dye and an ethylenically unsaturated compound are contained in a polymer complex salt as mentioned above, such additives are thus uniformly dispersed with said polymer complex salt as a matrix. According to the composition, preservation stability of the light-sensitive composition is markedly improved as one of the characteristics of the present invention, which effects can be estimated to be obtained by preventing the additives from diffusion by the dispersed structure.

The light-sensitive composition of the present invention can cure immediately by irradiating light without affecting by oxygen in air to become insoluble in a developer. Thus, it is not necessary to provide an over layer on the light-sensitive layer and it is not necessary to carry out any heat treatment after exposure. Therefore, it has also a merit of carrying out development and printing with good state.

As another element to constitute the light-sensitive composition of the present invention, a polymerization inhibitor can be preferably used. Examples of which may include, for example, quinone type compounds such as hydroquinone, benzoquinone, etc.; phenol type compounds such as p-methoxyphenol, catechol, t-butylcatechol, 2-naphthol, etc.; N-nitrosophenyl hydroxylamine salt (e.g., a salt of cerium, aluminum, ammonium, etc.) as disclosed in Japanese Provisional Patent Publications No. 161097/1994, No. 260529/1998, etc.; and hindered phenol type compounds. These polymerization inhibitors may be preferably used in an amount in the range of 0.001 to 0.1 part by weight based on 1 part by weight of the ethylenically unsaturated compound.

Among the above-mentioned polymerization inhibitors, a hindered phenol type compound is preferably used. As the hindered phenol type compound, those conventionally known compounds can be used. Examples of which may include, for example, 2,6-di-t-butyl-p-cresol, butyrated hydroxyanisole, 2,2'-methylenebis(4-methyl-6-t-butylphenol), 2,2'-methylenebis(4-ethyl-6-t-butylphenol), 1,1,3-tris(2-methyl-4-hydroxy-5-t-butylphenyl)butane, 4,4'-butylidenebis(3-methyl-6-t-butylphenol), tetrakis-[methylene-3-(3',5'-di-t-butyl-4'-hydroxyphenyl)propionate]methane, bis[3,3'-bis(4'-hydroxy-3'-t-butylphenyl)butyric acid]glycol ester, etc.

By using the above-mentioned hindered phenol type compound in combination with the light-sensitive composition of the present invention, a lithographic printing plate having high sensitivity, causing no scumming by preservation with a lapse of time and having high processing stability can be obtained.

In the present invention, as the other element to constitute the light-sensitive composition, addition of a colorant is preferably carried out. The colorant is used for the purpose of heightening visible recognition property at an image portion after exposure and development treatments. As the colorant, various kinds of dyes and pigments such as carbon black, phthalocyanine type dye, triarylmethane type dye, anthraquinone type dye, azo type dye, etc. An amount of the colorant is preferably used in an amount in the range of 0.005 part by weight to 0.5 part by weight based on 1 part by weight of the binder.

To the light-sensitive composition of the present invention, other additives may be added for various purposes in addition to the above-mentioned elements. For example, inorganic fine particles or organic fine particles maybe preferably added for the purpose of improving sharpness of an image after the development.

The light-sensitive composition of the present invention is suitable for a lithographic printing plate. That is, a lithographic printing plate having a light-sensitive layer comprising the above-mentioned light-sensitive composition on a support has high sensitivity which can cope with laser beam exposure and high printing endurance, and scumming after preservation for a long period of time can be markedly improved.

A dry film thickness of the light-sensitive layer when it is used as a lithographic printing plate is preferably within the range of 0.5 $\mu$m to 10 $\mu$m, more preferably 1 $\mu$m to 5 $\mu$m to markedly improve printing endurance. The light-sensitive layer can be formed by coating a solution of the light-sensitive composition having the above-mentioned constitution on a support by using conventionally known coating system, and drying. As a support, there may be mentioned, for example, a film, a polyethylene-coated paper, an aluminum plate, etc., and preferred support is a polished aluminum plate having an anodized film.

For using a light-sensitive material having a light-sensitive layer coated on a support as mentioned above for a lithographic printing plate, contact exposure or laser scanning exposure is carried out to the light-sensitive material, and then, a developing treatment is carried out by using an alkaline developer. An exposed portion of the light-sensitive layer is cross-linked to decrease the solubility to the alkaline developer while an unexposed portion of the same is dissolved by the alkaline developer to form an image pattern.

In the present invention, particularly preferred laser light source to be used for the laser scanning exposure is a laser having an oscillation wavelength at a near infrared region, and various kinds of semiconductor laser, a YAG laser or a solid laser such as a glass laser, etc., are preferably used.

As the alkaline developer to be used in the present invention, it is not particularly limited so long as it dissolves the polymer according to the present invention. Examples of which may preferably include, for example, an aqueous developer into which an alkaline compound such as sodium hydroxide, potassium hydroxide, sodium silicate, potassium silicate, sodium metasilicate, potassium metasilicate, monoethanolamine, diethanolamine, triethanolamine, tetramethyl ammonium hydroxide, etc., since they can selectively dissolve the unexposed portion well and expose the support surface. Moreover, various kinds of alcohols such as ethanol, propanol, isopropanol, ethylene glycol, diethylene glycol, triethylene glycol, glycerin, benzyl alcohol, etc., are preferably added to the alkaline developer. After carrying out the developing treatment by using such an alkaline developer, usual gum coating is preferably carried out by using Gum Arabic, etc.

As a developer to be used for carrying out a developing treatment of the negative type lithographic printing plate using the light-sensitive material of the present invention without effecting heat treatment after exposure, preferably used is a developer containing an alkali metal silicate and an alkali metal hydroxide, and a concentration of $SiO_2$ in the alkali metal silicate is 1 to 4% by weight and a concentration of the alkali metal hydroxide is 1 to 5% by weight, preferably 2 to 5% by weight. Moreover, a developer having a molar ratio of $SiO_2/M_2O$ (where M represents an alkali metal) being within the range of 0.5 to 1.1 is preferably used. The alkali metal silicate means at least one compound selected from sodium silicate, potassium silicate and lithium silicate, and the alkali metal hydroxide means at least one compound selected from sodium hydroxide, potassium hydroxide and lithium hydroxide. They are used alone or in combination of two or more. Also, it is preferred that potassium ion is contained in an amount of at least 50 mol % based on the total alkali metal ion as an alkali metal ion in the alkali metal silicate and the alkali metal hydroxide since developability is improved, and most preferably whole alkali metal ions are potassium ions.

By developing a negative-type lithographic printing plate using the light-sensitive composition of the present invention with the above-mentioned developer, an ink-receptive property, stain preventive property and printing endurance are further improved.

Also, it is preferred that a surfactant is added to the developer to improve wetting property of the developer to the surface of the light-sensitive layer and promote impregnation of the developer into the light-sensitive layer. As the surfactant, there may be mentioned a cationic, an anionic, a nonionic or an amphoteric surfactant. An amount of the surfactant is preferably within the range of 0.01 to 5% by weight based on the total amount of the developer, and particularly preferably within the range of 0.05 to 2% by weight. Also, particularly when it is contained in an amount of 0.1 to 2% by weight, occurrence of sludge in the developer can be effectively prevented even when a plural number of light-sensitive materials are to be developed during the developing treatment, so that it is particularly preferred. Examples of surfactants preferably used in the developer are mentioned below.

As the cationic surfactant, there may be mentioned, for example, quaternary ammonium salts such as lauryltrimethyl ammonium chloride, cetyltrimethyl ammonium chloride, stearyltrimethyl ammonium chloride, behenyltrimethyl ammonium chloride, distearyldimethyl ammonium chloride, perfluorotrimethyl ammonium chloride, laurylpyridinium chloride, etc.; imidazoline derivatives such as 2-octadecyl-hydroxyethyl-2-imidazoline, etc.; amine salts such as N,N-diethyl-stearo-amide-methylamine hydrochloride, polyoxyethylene stearylamine, etc.

As the anionic surfactant, there may be mentioned, for example, higher fatty acid salts such as sodium laurate, sodium stearate, sodium oleate, etc.; alkyl sulfuric acid ester salts such as sodium lauryl sulfate, sodium stearyl sulfate, etc.; higher alcohol sulfuric acid esters such as sodium octyl alcohol sulfate, sodium lauryl alcohol sulfuric acid ester, ammonium lauryl alcohol sulfuric acid ester, etc.; alkylbenzene sulfonic acid salts such as sodium dodecylbenzene sulfonate, etc.; alkyl-naphthalene sulfonic acid salts such as sodium isopropyl-naphthalene sulfonate, etc.; alkyl diphenyl ether disulfonic acid salts such as sodium alkyl diphenyl ether disulfonate, etc.; alkyl phosphoric acid ester salts such as sodium lauryl phosphate, sodium stearyl phosphate, etc.; polyethylene oxide adducts of alkyl ether sulfonates such as a polyethylene oxide adduct of sodium lauryl ether sulfate, a polyethylene oxide adduct of ammonium lauryl ether sulfate, a polyethylene oxide adduct of triethanol amine lauryl ether sulfate, etc.; polyethylene oxide adducts of alkyl phenyl ether sulfates such as a polyethylene oxide adduct of sodium nonyl phenyl ether sulfate, etc.; polyethylene oxide adducts of alkyl ether phosphates such as a polyethylene oxide adduct of sodium lauryl ether phosphate, etc.; polyethylene oxide adducts of alkylphenyl ether phosphates such as a polyethylene oxide adduct of sodium nonyl phenyl ether phosphate, etc.

As the nonionic surfactant, there maybe mentioned, for example, polyethylene glycols such as polyethylene glycol, polyethylene glycolpolypropylene glycol block copolymer, etc.; polyethylene glycol alkyl ethers such as polyethylene glycol cetyl ether, polyethylene glycol stearyl ether, polyethylene glycol oleyl ether, polyethylene glycol behenyl ether, etc.; polyethylene glycol polypropylene glycol alkyl ethers such as polyethylene glycol polypropylene glycol cetyl ether, polyethylene glycol polypropylene glycol decyltetradecyl ether, etc.; polyethylene glycol alkyl phenyl ethers such as polyethylene glycol octyl phenyl ether, polyethylene glycol nonyl phenyl ether, etc.; (poly) ethylene glycol fatty acid esters such as ethylene glycol monostearete, ethylene glycol distearate, diethylene glycol stearate, polyethylene glycol distearate, polyethylene glycol monolaurate, etc.; glycerin fatty acid esters such as glyceryl monomyristate, glyceryl monostearate, glyceryl monoisostearate, glyceryl distearate, glyceryl monooleate, glyceryl dioleate, etc.; and their polyethylene oxide adducts; sorbitan fatty acid esters such as sorbitan monopalmitate, sorbitan monostearate, sorbitan trioleate, sorbitan monooleate, sorbitan trioleate, etc.; and their polyethylene oxide adducts; sorbit fatty acid esters such as sorbitol monolaurate, sorbitol tetrastearate, sorbitol hexastearate, sorbitol tetraoleate, etc.; and their polyethylene oxide adducts, polyethylene oxide adduct of linseed oil, etc.

As the amphoteric surfactant, there maybe mentioned, for example, betaine type compounds such as N-lauryl-N,N-dimethyl-N-carboxymethyl ammonium, N-stearyl-N,N-dimethyl-N-carboxymethyl ammonium, N-lauryl-N,N-dihydroxyethyl-N-carboxymethyl ammonium, N-lauryl-N,N,N-tris(carboxymethyl) ammonium, etc.; imidazolium salts such as 2-alkyl-N-carboxymethyl-N-hydroxyethyl imidazolium, etc.; imidazolines such as imidazolin-N-sodium ethylsulfonate, imidazolin-N-sodium ethylsulfate, etc.

Of these surfactants, preferred are quaternary ammonium salts as the cationic surfactant; polyethylene glycol derivatives, polyethylene oxide derivatives such as polyethylene oxide adducts, etc., as the nonionic surfactants; and betaine type compounds as the amphoteric surfactant.

In the present invention, the developing treatment is preferably carried out at a developer temperature of 35° C. or lower in the point of printing endurance.

In the present invention, when developing treatment is carried out, an automatic processor is preferably carried out. At the automatic developer, a developing portion, a washing portion and a rinsing portion are preferably provided, and at the developing portion, a mechanism of providing a developer on the surface of a lithographic printing plate by shower or a mechanism of immersing the printing plate into the developer is preferably provided. Moreover, at the developing portion, it is preferably carried out to provide a mechanism in which the light-sensitive layer which becomes a non-image portion (unexposed portion) is scraped off by rubbing the surface of the light-sensitive layer with a driving type molton roller or brush roller. At the washing portion subsequent to the developing portion, it can be carried out by either of the methods wherein washing water is fed by utilizing shower, etc., on the surface of the printing plate, or the printing plate is immersed in a washing tank provided to carry our washing. Moreover, at a rinsing portion subsequent to the washing portion, a step of coating a solution containing Gum Arabic, etc., which is the so-called gum solution for protecting the surface of the printing plate is preferably provided, and further a drying step is preferably provided.

As the molton roller to be preferably provided at the developing portion or the washing portion, there may be mentioned a roll in which a molton cloth formed by knitting fibers such as rayon-, polypropylene, vinylon, etc., is would onto a rubber roller such as a nitrile rubber, an ethylene-propylene copolymer rubber, a polyurethane, etc. The surface of the molton at this time is preferably formed by a fiber layer with a surface as smooth as possible, and it is preferred that it frets the surface of the light-sensitive layer uniformly by taking a measure to prevent hairiness, etc. Moreover, the molton roller is, as a driving roller, preferably rotated to the same or reverse direction to a feeding direction of a printed plate without synchronizing with a feeding rate of the printing plate to be fed, whereby a residual film of the non-image portion can be effectively removed. When the driving roller rotates to the same direction to the feeding direction, it is preferred that relative rates of the surface of the driving roller and the surface of the printing plate to be fed are not the same but a relative rate of the surface of the driving roller is made faster than that of the surface of the printing plate since an effect of surface rubbing can be obtained. Also, when a rotating direction of the driving roller is reverse to the feeding direction, the surface is effectively fretted so that it is preferred. With regard to the brush roller to be preferably provided at the developing portion or the washing portion, there may be mentioned a brush roller using brush wire made of a polyamide such as Nylon (trade name), a polypropylene, etc. In this case, the brush roller is preferably a driving roller which is driven by a driving apparatus, and rotated to the same or reverse direction to the feeding direction of the printing plate. The roller is preferably rubbing the surface of the printing plate, and a built-in roller brush and a channel roller brush, etc. are preferably used.

In the above-mentioned preferred embodiment of the automatic developer, molton roller or brush roller which is rubbing the surface of the light-sensitive layer is not provided at the developing portion but the molton roller or the brush roller is provided at the washing portion. In more detail, it is a developing machine in which dissolution and removal of the light-sensitive layer are not carried out at the developing portion and they are carried out at the next washing portion.

In the above-mentioned case, components of the light-sensitive layer are not dissolved in the developer, so that a problem of change in the developer characteristics and increment in a replenishing solution can be avoided, and there is a merit that a number of plates can be carried out stably for a long period of time. Also, as compared with the case where dissolution and removal of the light-sensitive layer (non-image portion) was carried out at the developing portion, damage to the developing portion becomes little, whereby an image quality, ink receptivity and printing endurance are improved.

EXAMPLES

In the following, the present invention will be described in more detail, but the present invention is not limited by these Examples as well as the effects as a matter of course. All part(s) in Examples mean part(s) by weight.

Example 1

A solution of a light-sensitive composition having the following prescription was prepared, and coated on an aluminum plate with a thickness of 0.24 mm, to which a sand blasting treatment and anodizing treatment were carried out, by using a wire bar so that a dry film thickness of 3 microns to forma sample (Comparative example 1) in which a light-sensitive composition had been coated was prepared.

| <Solution of light-sensitive composition> | |
|---|---|
| 10% Dioxane solition of alkali-soluble polymer Copolymer of acryl methacrylate (70% by weight) and methacrylic acid (30% by weight) | 100 parts by weight |
| Pentaerythritol triacrylate as ethylenically unsaturated compound | 5 parts by weight |
| Photopolymerization initiator | 3 parts by weight |
| (S-34) as sensitizing dye | 0.3 part by weight |
| Compound A | 1 part by weight |
| 2,6-Di-tert-butylcresol as polymerization inhibitor | 0.1 part by weight |
| 1,3-Dioxolane | 20 parts by weight |
| Cyclohexane as solvents | 20 parts by weight |

By changing the photopolymerization initiator and Compound A of the above-mentioned solution of a light-sensitive composition to that shown in Table 1, light-sensitive materials were each prepared as mentioned below.

With regard to the light-sensitive material prepared as mentioned above, by using an outer surface drum system plate setter (manufactured by Dainippon Screen Manufacturing Co., PT-R4000, trade name) mounting thereon a 830 nm semiconductor laser, exposure tests were carried out by changing a laser irradiation energy variously with a drum rotating rate of 600 to 1000 rpm. After the exposure, development was carried out by using an automatic processor PD-912M for a PS plate (trade name, manufactured by Dainippon Screen Manufacturing Co.) and using a developer in which a 2% by weight of potassium silicate, 1.5% by weight of potassium hydroxide and 1% by weight of benzyl alcohol had been dissolved therein with a liquid temperature of 30° C. for 20 seconds. A minimum exposure energy by which a 20 μm line-pattern is clearly formed on an aluminum plate is made sensitivity of the light-sensitive material and showed with a unit of $mJ/cm^2$ (a smaller value means high sensitivity). The results are summarized in Table 1.

TABLE 1

| Light-sensitive material | Photopolymerization initiator | Compound A | Sensitivity | Remarks |
|---|---|---|---|---|
| 1 | BC-6 | None | >600 | Comparative |
| 2 | BC-6 | A-1 | >600 | Comparative |
| 3 | BC-6 | A-2 | >600 | Comparative |
| 4 | BC-6 | A-3 | >600 | Comparative |
| 5 | BC-6 | HA-5 | 300 | This invention |
| 6 | BC-6 | HA-8 | 350 | This invention |
| 7 | BC-2 | HA-5 | >600 | Comparative |
| 8 | BS-1 | HA-5 | >600 | Comparative |
| 9 | PI-1 | HA-5 | >600 | Comparative |
| 10 | PI-2 | HA-5 | >600 | Comparative |
| 11 | PI-3 | HA-5 | >600 | Comparative |

In the table, abbreviations mean as follows.
PI-1: 2-(2'-Chlorophenyl)-4,5-diphenylimidazole dimer
PI-2: 4,4'-Bis(diethylamino)benzophenone
PI-3: 2-Mercaptobenzothiazole
A-1: 3-Amino-1,2,4-triazole
A-2: N,N,N',N'-Tetraethylmethylenediamine
A-3: 2-t-Butyl-4-methyl-phenol Moreover, as Comparative examples, the polymer in the composition of the light-sensitive material 5 in Table 1 was replaced with a phenol resin (Shownol BRM-565, trade name, available from Showa Kobunshi K.K.; condensate of meta-cresol and formalin, average polymerization degree: 21 to 29) or polyvinyl phenol (Marukalyncur S-2P, trade name, available from Maruzen Sekiyu Kagaku Co., weight average molecular weight: 4900) to prepare light-sensitive materials 12 and 13, respectively, in the same manner as in the light-sensitive material 5.

With regard to the above-mentioned comparative light-sensitive materials 12 and 13, sensitivities were measured in the same manner as mentioned above. As a result, it was found that both had sensitivity of 600 mJ/cm² or more.

From the above results, it can be understood that sensitivity of the light-sensitive compositions of the present invention is markedly increased.

Example 2

In the same manner as in the light-sensitive material 5 in Example 1 except for changing the polymer in the composition of the light-sensitive material 5 to P-1 or P-7, light-sensitive materials 14 and 15 were prepared and sensitivity thereof were evaluated in the same manner as in Example 1. As a result, it was found that sensitivity of the light-sensitive material 14 was 150 mJ/cm², and that of the light-sensitive material 15 was 200 mJ/cm².

Example 3

In the same manner as in the light-sensitive material 5 except for changing the polymer in the composition of the light-sensitive material 5 in Example 1 to P-1, and changing the ethylenically unsaturated compound to C-5, a light-sensitive material 16 was prepared and sensitivity thereof was evaluated in the same manner as in Example 1. As a result, it was found that sensitivity thereof was 100 mJ/cm².

Example 4

In the same manner as in the light-sensitive material 5 except for changing the polymer in the composition of the light-sensitive material 5 in Example 1 to P-1, changing the ethylenically unsaturated compound to C-5 and further the photopolymerization initiator to a combined system of BC-2 (2 parts by weight) and BS-2 (1 part by weight), a light-sensitive material 17 was prepared. Also, by changing the photopolymerization initiator of the above light-sensitive material 17 to a combined system of BC-6 (2 parts by weight) and T-4 (1 part by weight), a light-sensitive material 18 was prepared. Sensitivity of these light-sensitive materials were evaluated in the same manner as in Example 1. As a result, it was found that both had sensitivity of 20 mJ/cm².

Example 5

In the same manner as in the light-sensitive material 17 in Example 4 except for changing the photopolymerization initiator to a combined system of BC-7 (2 parts by weight) and BS-2 (1 part by weight), a light-sensitive material 19 was prepared. Also, by changing the photopolymerization initiator of the above light-sensitive material 17 to a combined system of BC-7 (2 parts by weight) and T-4 (1 part by weight), a light-sensitive material was prepared. Sensitivity of these light-sensitive materials was evaluated in the same manner as in Example 1. As a result, it was found that both had sensitivity of 10 mJ/cm².

Example 6

In the same manner as in the light-sensitive material 5 in Example 1 except for changing the hindered amine (HA-5) in the composition of the light-sensitive material 5 to a protonic acid captor (AC-1), a light-sensitive material 21 was prepared and sensitivity thereof was evaluated in the same manner as in Example 1. As a result, it was found that sensitivity thereof was 400 mJ/cm².

Example 7

In the same manner as in the light-sensitive material 17 in Example 1 except for changing the hindered amine (HA-5) in the composition of the light-sensitive material 17 to a protonic acid captor (AC-1), a light-sensitive material 22 was prepared and sensitivity thereof was evaluated in the same manner as in Example 1. As a result, it was found that sensitivity thereof was 50 mJ/cm².

Example 8

With regard to the light-sensitive materials 1–22 prepared in the above examples, they were preserved at 40° C. for 10 days, and then, laser exposure and developing treatment were carried out according to the same manner as in Example 1 to prepare lithographic printing plates. With regard to these lithographic printing plates, printing tests were carried out by using a usual offset printer and presence or absence of scumming at anon-image portion and printing endurance were evaluated. With regard to the presence or absence of the scumming, judgment was carried out by observing the presence or absence of scumming at the white portion of a printed paper by ink after carrying out 1,000 sheets of printing. Also, printing endurance was evaluated by a maximum number of printed sheets in which printing quality is not changed. As a result, the lithographic printing plates of the present invention did not cause scumming and printing was each possible with 100,000 sheets or more. To the contrary, in the lithographic printing plates for comparative purpose, they all generated scumming and printing was possible until 50,000 sheets or less.

Example 9

Light-sensitive materials 14a to 22a were prepared in the same manner as in the above-mentioned light-sensitive materials 14 to 22 of the present invention except for changing the sensitizing dye in the compositions of the light-sensitive materials 14 to 22 to S-20 (0.5 part by weight) to prepare light-sensitive materials 14a to 22a corresponding to the light-sensitive materials 14 to 22, respectively. These light-sensitive materials were subjected to exposure tests by using a violet laser diode-mounted output machine: Image Setter Cobalt 8CTP manufactured by ESHER GRAD Co. (oscillation wavelength: 405 nm, output: 30 mW). After exposure, development was carried out by using the same alkaline developer as in Example 1and evaluated whether fine line with 10 micron can be clearly formed on an aluminum plate or not. As a result, in either of the light-sensitive materials, fine line with 10 micron was clearly formed on the aluminum plate. Also, lithographic printing plates were prepared by using these light-sensitive materials, and printing was carried out in the same manner as in Example 8. As a result, either of the lithographic printing plates did not cause any scumming and printing was possible with 100,000 sheets or more.

Example 10

A lithographic printing plate was prepared by using the light-sensitive material 14 prepared in Example 2 to which the following treatments were carried out. First, by using Plate Setter PT-R4000, trade name, manufactured by Dainippon Screen Manufacturing Co., exposure of a test image was carried out under the conditions of a drum rotating rate of 1000 rpm, dissolution of 2400 dpi and an image surface area of 20%. Next, by using the developers having the following prescriptions, developing treatment was carried out under the following conditions.

As an aqueous potassium silicate solution as a component for the developer, an aqueous potassium silicate solution available from Tama Chemicals Co., Ltd. An amount of $SiO_2$ contained therein is 20% and that containing further 10% of KOH was also used. To this aqueous potassium silicate solution was further added KOH and adjusting an amount of KOH to prepare respective developers mentioned below. Moreover, as a surfactant, polyethylene glycol (added molar number=5) monostearate was added thereto in an amount of 0.3% and deionized water was added to the respective developers to make up the total amount thereof 100 liters.

TABLE 2

| Developer | $SiO_2$ (% by weight) | KOH (% by weight) | $SiO_2/M_2O$ (Molar ratio) |
| --- | --- | --- | --- |
| Developer 1 | 1.0 | 4.0 | 0.87 |
| Developer 2 | 2.0 | 3.5 | 1.00 |
| Developer 3 | 2.0 | 3.3 | 1.07 |
| Developer 4 | 1.2 | 3.5 | 0.60 |
| Developer 5 | 1.2 | 3.0 | 0.70 |

As an automatic processor to practice development, PD-912M, trade name, manufactured by Dainippon Screen Manufacturing Co. was used to carry out development. As the developer, the above-mentioned developers were used. In this PD-912M, a molton roller which is a driving roller is provided in a developing tank and it has a structure of rubbing the surface of the light-sensitive layer in the developer. Rotating direction of the molton roller which is a driving roller is the same as the feeding direction of the material to be developed. Surface fretting was carried out by rotating the molton roller with the relative rate about twice the feeding rate of the printing plate. At the final treatment portion, a mechanism of feeding a gum solution is provided, and as a gum solution, a solution in which Ultra PS gum available from K.K. Nikken Kagaku Kenkyusho was diluted with water to 1:1 was used.

In the developing tank, 18 liters of the developer was placed, and as a replenishing solution, a developer having the same composition was supplemented in an amount of 30 ml per one printing plate. Washing water and the gum solution were fed by circulating them from tanks provided at the outside portion of the automatic developer. Dipping conditions in the developer are set to a liquid temperature of 32° C. and a dipping time of 14 seconds.

Printing properties of the lithographic printing plates subjected to the above-mentioned treatment were evaluated under the following conditions. As a printing machine, Ryobi-560, trade name, manufactured by Ryobi K.K., was used. As printing ink, F gloss black B, trade name, available from Dainippon Ink K.K. was used and as a damping water, commercially available damping water was used by diluting it. As printing evaluation items, a number of printed sheets from the beginning of the printing to the time when an ink concentration transferred to a printing paper becomes sufficient and stabilized is shown as ink receptivity, and a small number of sheets means good. Also, with regard to printing endurance, evaluation was carried out with a number of printed sheets until minor dots and fine lines in the test image starts to lack. Moreover, the presence or absence of scumming was evaluated with naked eyes by the presence or absence of scumming on the printed material.

As a result of the tests, lithographic printing plates subjected to developing treatment using the developers 1 to 5 showed ink receptivity of 5 sheets or less, printing endurance of 200,000 sheets or more and no scumming.

Example 11

A lithographic printing plate was prepared by using the light-sensitive material 14 prepared in Example 2 to which the following treatments were carried out. First, by using Plate Setter PT-R4000, trade name, manufactured by Dainippon Screen Manufacturing Co., exposure of a test image was carried out under the conditions of a drum rotating rate of 1000 rpm, dissolution of 2400 dpi and an image surface area of 20%. Next, by using the developer 2 prepared in Example 10, developing treatment was carried out under the following conditions.

As an automatic processor to practice development, P-α880, trade name, manufactured by Mitsubishi Paper Mills Ltd. was used to carry out development of the above-mentioned lithographic printing plate. In this P-α880, driving rollers for feeding were provided at the inlet and exit portions of the developing tank, and a guide roller which is non-driving roller is provided at the center portion, the lowest portion of the developing tank, but no means for rubbing the surface of the light-sensitive layer was provided. As the washing portion subsequent to the developing tank, driving rollers for feeding were provided at the inlet and exit portions, and a molton roller which is a driving roller is provided at the center portion. This molton roller is so rotated that a relative rate to that of the printing plate becomes 5 times to the same direction as that of the feeing direction and so adjusted that it frets the surface of the light-sensitive layer. At the washing portion, as a feeding device for washing water, shower mechanisms were provided between the driving roller at the inlet portion and the molton roller, and between the driving roller at the exit portion and the molton roller, so that it is so designed that washing water is fed on the surface of the lithographic printing plate. Incidentally, in the P-α880, subsequent to the washing portion, a second washing portion is further provided, but this second washing portion was not used for carrying out the Example of the present invention. At the final treatment portion in the P-α880, a mechanism of feeding a gum solution is provided, and as a gum solution, a solution in which Ultra PS gum available from K.K. Nikken Kagaku Kenkyusho was diluted with water to 1:1 was used.

Into the developing tank was thrown 18 liters of the developer (A), and as a replenishing solution, a developer having the same composition as the developer (A) was supplemented in an amount of 30 ml per one printing plate. Washing water and the gum solution were fed by circulating them from tanks provided at the outside portion of the automatic developer. Dipping conditions in the developer are set to a liquid temperature of 30° C. and a dipping time of 15 seconds. A plural number of exposed lithographic printing plates previously prepared was processed with 50 sheets in average per day. For carrying out the processing, the state of the developer (a degree of coloration, and occurrence of suspended material or sludge) was observed. The developer was colorless and transparent at the initial stage, and at the processing of 500 sheets or later, it was lightly colored but occurrence of suspended material or sludge was never observed.

Printing properties of the lithographic printing plates subjected to the above-mentioned treatment were evaluated under the following conditions. As a printing machine, Ryobi-560, trade name, manufactured by Ryobi K.K., was used. As printing ink, F gloss black B, trade name, available from Dainippon Ink K.K. was used and as a damping water, commercially available damping water was used by diluting it. As printing evaluation items, a number of printed sheets from the beginning of the printing to the time when an ink concentration transferred to a printing paper becomes sufficient and stabilized is shown as ink receptivity, and a small number of sheets means good. Also, with regard to printing endurance, evaluation was carried out with a number of printed sheets until minor dots and fine lines in the test image starts to lack. Moreover, the presence or absence of scumming was evaluated with naked eyes by the presence or absence of scumming on the printed material. When the processing was carried out continuously, the printing evaluation results are also shown in Table 3.

TABLE 3

| Days processed | Number of sheets treated (in total) | State of developer | Ink receptivity | Printing endurance | Scumming |
|---|---|---|---|---|---|
| 1 day | 50 | Transparent and clear | 5 sheets | 200,000 or more | None |
| 10 days | 500 | Slightly colored and transparent | 5 sheets | 200,000 or more | None |
| 20 days | 1000 | Slightly colored and transparent | 5 sheets | 200,000 or more | None |
| 30 days | 1500 | Slightly colored and transparent | 5 sheets | 200,000 or more | None |

In addition to the above evaluations, image quality of the printed material developed was evaluated at the respective treated days. Evaluated items are that whether dots within the range of 1% to 99% are reproduced on the printed plate or not as a reproduction range of 133 lines dots, whether 20 microns fine line is uniformly reproduced or not, presence or absence of flaw on the image and presence, or absence of remaining residual film at the non-image portion, which were all evaluated with naked eyes. As a result, lithographic printing plate with good image quality can be stably obtained through 30 days continuous processing (running processing).

What is claimed is:

1. A light-sensitive composition which comprises a polymer comprising a carboxyl group and a polymerizable double bond at the side chain, an organic borate salt, an ethylenically unsaturated compound, and a hindered amine compound or a protonic acid captor.

2. The light-sensitive composition according to claim 1, wherein the ethylenically unsaturated compound is a polymerizable compound having two or more polymerizable double bond in the molecule.

3. The light-sensitive composition according to claim 2, wherein the polymerizable compound is a monomer or an oligomer.

4. The light-sensitive composition according to claim 1, wherein the polymer is a polymer having a phenyl group to which a vinyl group is substituted at the side chain.

5. The light-sensitive composition according to claim 1, wherein the polymer is a polymer having a group represented by the following formula (4):

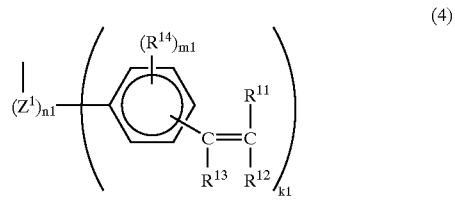

wherein $Z^1$ represents a linking group; $R^{11}$, $R^{12}$ and $R^{13}$ each represent a hydrogen atom, a halogen atom, a carboxyl group, a sulfa group, a nitro group, a cyano group, an amide group, an amino group, an alkyl group, an aryl group, an alkoxy group or an aryloxy group; $R^{14}$ is a substitutable group or atom; $n_1$ is 0 or 1; $m_1$ is an integer of 0 to 4; and $k_1$ is an integer of 1 to 4, at the side chain.

6. The light-sensitive composition according to claim 1, wherein the hindered amine compound is a compound having at least one structural unit represented by the following formula (1):

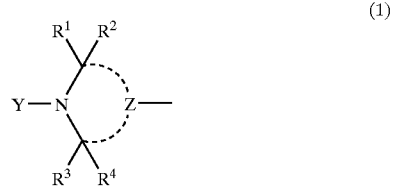

wherein $R^1$, $R^2$, $R^3$ and $R^4$ each represent a hydrogen atom, an alkyl group or an aryl group; Z represents an atomic group necessary for forming a nitrogen-containing aliphatic ring; Y represents a hydrogen atom, an alkyl group or an organic residue; among $R^1$ and $R^2$, or among $R^3$ and $R^4$, one of which may be incorporated into Z and provide a double bond.

7. The light-sensitive composition according to claim 1, wherein the protonic acid captor is a compound which is capable of forming a difficultly soluble salt by bonding to the protonic acid.

8. The light-sensitive composition according to claim 1, wherein the protonic acid captor is a compound represented by the following formula (2):

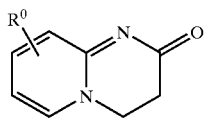

(2)

wherein $R^0$ represents a hydrogen atom, a substituted or unsubstituted alkyl group, a substituted or unsubstituted aryl group, a carboxyamide group, a hydroxyl group or a condensed ring.

9. The light-sensitive composition according to claim 1, wherein the organic borate salt is a compound having an organic boron anion represented by the following formula (3):

(3)

wherein $R^5$, $R^6$, $R^7$ and $R^8$ each represent an alkyl group, an aryl group, an aralkyl group, an alkenyl group, an alkynyl group, a cycloalkyl group or a heterocyclic group.

10. The light-sensitive composition according to claim 1, wherein the composition further comprises a sensitizing dye which sensitizes the organic borate salt at a wavelength region of 380 nm to 1300 nm.

11. The light-sensitive composition according to claim 1, wherein the composition further comprises a sensitizing dye which sensitizes the organic borate salt at a wavelength region of 380 nm to 410 nm.

12. The light-sensitive composition according to claim 1, wherein the composition further comprises a sensitizing dye which sensitizes the organic borate salt at a wavelength region of 750 nm or longer.

13. The light-sensitive composition according to claim 1, wherein the composition further comprises a trihaloalkyl-substituted compound.

14. The light-sensitive composition according to claim 13, wherein the trihaloalkyl-substituted compound is a nitrogen-containing heterocyclic compound having a trihalomethyl group or a trihalomethylsulfonyl compound.

15. A lithographic printing plate which comprises an aluminum plate and a light-sensitive layer comprising the light-sensitive composition according to claim 1.

* * * * *